US012668548B2

(12) United States Patent
Leng et al.

(10) Patent No.: US 12,668,548 B2
(45) Date of Patent: Jun. 30, 2026

(54) DEVELOPMENT OF HIGH POWER TEXTURED PIEZOELECTRIC CERAMICS WITH ULTRAHIGH ELECTROMECHANICAL PROPERTIES FOR LARGE DRIVING FIELD APPLICATIONS

(71) Applicant: THE PENN STATE RESEARCH FOUNDATION, University Park, PA (US)

(72) Inventors: Haoyang Leng, State College, PA (US); Yongke Yan, Port Matilda, PA (US); Shashank Priya, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 595 days.

(21) Appl. No.: 17/909,468

(22) PCT Filed: Jul. 1, 2021

(86) PCT No.: PCT/US2021/040173
§ 371 (c)(1),
(2) Date: Sep. 6, 2022

(87) PCT Pub. No.: WO2022/035523
PCT Pub. Date: Feb. 17, 2022

(65) Prior Publication Data
US 2023/0145627 A1 May 11, 2023

Related U.S. Application Data

(60) Provisional application No. 63/256,725, filed on Oct. 18, 2021, provisional application No. 62/705,842, filed on Jul. 17, 2020.

(51) Int. Cl.
*C04B 35/499* (2006.01)
*C04B 35/64* (2006.01)
(Continued)

(52) U.S. Cl.
CPC ............ *C04B 35/499* (2013.01); *C04B 35/64* (2013.01); *H10N 30/097* (2023.02);
(Continued)

(58) Field of Classification Search
CPC .............. H10N 30/097; H10N 30/8548; C04B 35/499; C04B 35/64; C04B 2235/3235; C04B 2235/3267; C04B 2235/3281
See application file for complete search history.

(56) References Cited

U.S. PATENT DOCUMENTS 10,315,223 B2  6/2019  Zhang et al.

FOREIGN PATENT DOCUMENTS

CN     104987072     * 10/2015
CN     104987072 A   10/2015
(Continued)

OTHER PUBLICATIONS

International Search Report for PCT/US 2021/040173 dated Feb. 2, 2022.
(Continued)

*Primary Examiner* — C Melissa Koslow
(74) *Attorney, Agent, or Firm* — Buchanan Ingersoll & Rooney PC

(57) ABSTRACT

Embodiments relate to a piezoelectric ceramic and methods of making the same that is suitable for use as a high-power piezoelectric ceramic, and in particular a piezoelectric ceramic that exhibits both good hard properties and good soft properties. Embodiments involve generating the piezoelectric ceramic via the combination of chemical modification/doping and/or a texturing method so that the piezoelectric material exhibits a large figure of merit, as well as other hard and soft properties. The chemical modification involves Cu and Mn doping a piezoelectric material composition having a relaxor-lead titanate based ferroelectric structure.
(Continued)

The texturing involves templated grain growth (TGG) texturing using a BaTiO$_3$ (BT) template.

8 Claims, 42 Drawing Sheets

(51) Int. Cl.
*H10N 30/097* (2023.01)
*H10N 30/853* (2023.01)
(52) U.S. Cl.
CPC . *H10N 30/8548* (2023.02); *C04B 2235/3236* (2013.01); *C04B 2235/3267* (2013.01); *C04B 2235/3281* (2013.01)

(56) References Cited

FOREIGN PATENT DOCUMENTS

| | | | |
|---|---|---|---|
| CN | 105084898 | * | 11/2015 |
| CN | 105084898 | A | 11/2015 |
| CN | 110078508 | A | 8/2019 |
| CN | 110845230 | A | 2/2020 |
| CN | 111423231 | * | 7/2020 |

OTHER PUBLICATIONS

Written Opinion of the International Searching Authority for PCT/US 2021/040173 dated Feb. 2, 2022.

* cited by examiner

Exemplary Cu Doped Piezoelectric Ceramic Process

Exemplary Texturing Piezoelectric Ceramic Process

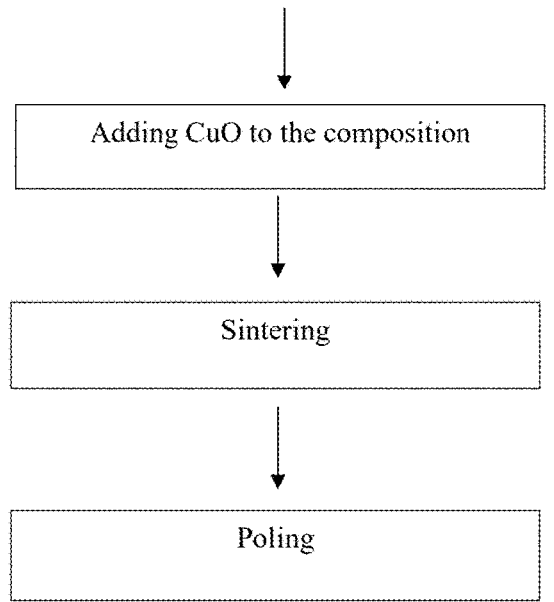

Forming a matrix powder with $MnO_2$ by:

- synthesizing through a two-step columbite precursor method;
- forming a matrix powder including a composition having a relaxor-lead titanate based ferroelectric structure.

Adding CuO to the composition

Sintering

Poling

Forming a matrix powder with $MnO_2$ by:

- synthesizing through a two-step columbite precursor method;
- forming a matrix powder including a composition having a relaxor-lead titanate based ferroelectric structure.

Optionally adding CuO to the composition

Preparing $BaTiO_3$ (BT) templates by a two-step topochemical microcrystal conversion (TMC) method Texturing by a templated grain growth (TGG) process using BT templates Sintering Poling

FIG. 1

DEVELOPMENT OF HIGH POWER TEXTURED PIEZOELECTRIC CERAMICS WITH ULTRAHIGH ELECTROMECHANICAL PROPERTIES FOR LARGE DRIVING FIELD APPLICATIONS

CROSS-REFERENCE TO RELATED APPLICATIONS

This application is the U.S. national stage application of International Patent Application No. PCT/US2021/040173, filed on Jul. 1, 2021, which is related to and claims the benefit of U.S. provisional application 62/705,842, filed on Jul. 17, 2020, the entire contents of which are incorporated herein by reference. This application also claims priority to U.S. provisional application 63/256,725, filed on Oct. 18, 2021, the entire contents of which are incorporated herein by reference.

STATEMENT REGARDING FEDERALLY SPONSORED RESEARCH OR DEVELOPMENT

This invention was made with government support under Grant No. HR00111920001 awarded by the Defense Advanced Research Projects Agency/DOD. The Government has certain rights in the invention.

FIELD OF THE INVENTION

Embodiments relate to a piezoelectric ceramic and methods of making the same that is suitable for use as a high-power piezoelectric ceramic, and in particular a piezoelectric ceramic that exhibits both good hard properties and good soft properties at the same time. Embodiments involve generating the piezoelectric ceramic via the combination of chemical modification/doping and/or a texturing method so that the piezoelectric material exhibits a large figure of merit $(Q_m \cdot d_{33} \cdot E_c)$.

BACKGROUND OF THE INVENTION

Piezoelectric ceramics are materials that enable the coupling between the electric and mechanical signals, and are widely used in electromechanical devices. For high power applications, e.g., SONAR projector, piezoelectric transformers, ultrasonic motors, actuators, underwater transducers, ultrasonic levitation, welding and cutting, ultrasonic cleaning, humidifier, cavitation, electro-acoustic devices, etc., it is typically desired for the piezoelectric ceramic to exhibit a high piezoelectric response (strain coefficient d and electromechanical coupling coefficient k), high mechanical quality factor $(Q_m)$, and high coercive field $(E_c)$. For instance, most of piezoelectrics used in high power device applications require high vibration velocity $v_{rms}$ of the piezoelectric element in order to possess ability to survive under high output power. A material with low vibration velocity will have high temperature rise under high electric or mechanical drive conditions and it will become depoled. In order to obtain a high vibration velocity $(v_{rms} \propto Q_m \cdot d)$, high power piezoelectric materials should possess high $Q_m$ and high $d_{33}$. Further, it should have high coercive field, $E_c$, in order to resist the depoling under high field conditions. Thus, a high, $Q_m$, d, and $E_c$ will allow for a piezoelectric ceramic to exhibit high vibration velocity $(v \propto Q_m \cdot d \cdot E_c)$. For high power piezoelectric applications subjected to high electric fields, high $E_c$ and low dielectric/mechanical losses (tan δ) are also desired. In addition, high k of piezoelectrics is typically desired for effective electric to mechanical energy conversion.

Accordingly, high-power piezoelectric materials suitable for such harsh high power operating conditions should possess both good soft properties (high sensitivity to electric fields) and good hard properties (require a high applied voltage for polarization to be very stable and operate well in environments with high mechanical or electric stress) at the same time. Yet, conventional polycrystalline piezoelectric materials are randomly oriented ceramics, which cannot have both high $Q_m$ and high $d_{33}$. One of the reasons for this is because efforts to increase in $Q_m$ and $E_c$ via domain pinning results in the degradation of $d_{33}$ and k. For instance, during fabrication (using conventional methods) of the high-power piezoelectric ceramic made from a polycrystal material, the hard properties (high $Q_m$ and low tan δ) caused by the pinned domain state will degrade the soft properties (high $d_{33}$ and high k) of piezoelectric ceramic.

BRIEF SUMMARY OF THE INVENTION

Embodiments relate to a piezoelectric ceramic and methods of making the same that is suitable for use as a high-power piezoelectric ceramic, and in particular a piezoelectric ceramic that exhibits both good hard properties and good soft properties at the same time. Embodiments involve generating the piezoelectric ceramic via the combination of chemical modification/doping and/or a texturing method so that the piezoelectric material exhibits a large $Q_m \cdot d \cdot E_c$, and a large figure of merit $(Q_m \cdot d_{33} \cdot E_c) = 1$ CV/Nm. A $Q_m \cdot d_{33} \cdot E_c = 1$ CV/Nm is over 2 times higher than conventional piezoelectric ceramics.

In an exemplary embodiment, a piezoelectric composition includes 0.24 $Pb(In_{1/2}Nb_{1/2})O_3$-0.42$Pb(Mg_{1/3}Nb_{2/3})O_3$-0.34$PbTiO_3$ (PIN-PMN-PT) doped with $MnO_2$ and CuO, wherein >0.0 wt % CuO<=0.5 wt % CuO, wherein $MnO_2$ is 2 mol %.

In some embodiments, a $d_{33}$=363 pC/N, $Q_m$=2800, $E_c$=10 KV/cm and $Q_m \cdot d_{33} \cdot E_c$=1 CV/Nm.

In some embodiments, the PIN-PMN-PT includes 0.0 wt % CuO and 2 mol % $MnO_2$, wherein $d_{33}$=370 pC/N, $Q_m$=1693, $E_c$=9.33 KV/cm, and a $Q_m \cdot d_{33} \cdot E_c$=0.584; the PIN-PMN-PT includes 0.125 wt % CuO and 2 mol % $MnO_2$, wherein $d_{33}$=363 pC/N, $Q_m$=2800, $E_c$=10.1 KV/cm, and a $Q_m \cdot d_{33} \cdot E_c$=1.03; the PIN-PMN-PT includes 0.25 wt % CuO and 2 mol % $MnO_2$, wherein $d_{33}$=374 pC/N, $Q_m$=2096, $E_c$=9.81 KV/cm, and a $Q_m \cdot d_{33} \cdot E_c$=0.769; or the PIN-PMN-PT includes 0.5 wt % CuO and 2 mol % $MnO_2$, wherein $d_{33}$=372 pC/N, $Q_m$=1921, $E_c$=10.1 KV/cm, and a $Q_m \cdot d_{33} \cdot E_c$=0.726.

In an exemplary embodiment, a piezoelectric composition includes 0.24 $Pb(In_{1/2}Nb_{1/2})O_3$-0.42$Pb(Mg_{1/3}Nb_{2/3})O_3$-0.34$PbTiO_3$ (PIN-PMN-PT) doped with $MnO_2$; wherein $MnO_2$ is 2 mol %; and wherein the composition is textured via a templated grain growth (TGG) method using a $BaTiO_3$ template.

In some embodiments, the $BaTiO_3$ content is >0.0 vol. %<=5 vol. %.

In some embodiments, the PIN-PMN-PT is doped with CuO.

In some embodiments, the composition has >0.0 wt % CuO<=0.5 wt % CuO.

In some embodiments, the PIN-PMN-PT includes 0.25 wt % CuO and 2 mol % $MnO_2$, wherein $d_{33}$>710 pC/N, $k_{31}$=0.52, and $Q_m$≈950.

In some embodiments, the PIN-PMN-PT includes 1 vol. % $BaTiO_3$, wherein $d_{33}$=457 pC/N, $Q_m$=1249, and $T_c$=207° C.; the PIN-PMN-PT includes 2 vol. % $BaTiO_3$, wherein $d_{33}$=517 pC/N, $Q_m$=1148, and $T_c$=205° C.; the PIN-PMN-PT includes 3 vol. % $BaTiO_3$, wherein $d_{33}$=529 pC/N, $Q_m$=1023, and $T_c$=205° C.; or the PIN-PMN-PT includes 5 vol. % $BaTiO_3$, wherein $d_{33}$=475 pC/N, $Q_m$=770, and $T_c$=199° C.

In an exemplary embodiment, a method of making a high-powered piezoelectric composition involves doping 0.24 $Pb(In_{1/2}Nb_{1/2})O_3$-0.42$Pb(Mg_{1/3}Nb_{2/3})O_3$-0.34$PbTiO_3$ (PIN-PMN-PT) with $MnO_2$ and CuO.

In some embodiments, the method involves texturing the Cu—Mn-doped PIN-PMN-PT via a templated grain growth method (TGG).

In some embodiments, the method the TGG involves use of a $BaTiO_3$ template.

In some embodiments, the method involves increasing the tetragonality degree PIN-PMN-PT via TGG.

In some embodiments, the $BaTiO_3$ content is >0.0 vol. %<=5 vol. %.

In some embodiments, $MnO_2$ is 2 mol %; and >0.0 wt % CuO<=0.5 wt % CuO.

In an exemplary embodiment, a piezoelectric ceramic composition is represented as x $Pb(In_{1/2}Nb_{1/2})O_3$-y $Pb(Mg_{1/3}Nb_{2/3})O_3$-(1−x−y) $PbTiO_3$ (PIN-PMN-PT), wherin x=0.20-0.27 and y=0.40-0.45; doped with $MnO_2$ (0.0-2.5 mol %) and CuO (0.0-0.5 wt %).

In an exemplary embodiment, a textured piezoelectric ceramic composition is represented as x $Pb(In_{1/2}Nb_{1/2})O_3$-y $Pb(Mg_{1/3}Nb_{2/3})O_3$-(1−x−y) $PbTiO_3$ (PIN-PMN-PT), wherin x=0.20-0.27 and y=0.40-0.45; doped with $MnO_2$ (0.0-2.5 mol %) and CuO (0.0-0.5 wt %); and modified using a 0.0-5 vol % $BaTiO_3$ template.

In an exemplary embodiment, a piezoelectric ceramic composition is represented as x $Pb(X_{1/2}Nb_{1/2})O_3$-y $Pb(Y_{1/3}Nb_{2/3})O_3$-(1−x−y) $PbTiO_3$ (PIN-PMN-PT), wherein x=0.20-0.27 and y=0.40-0.45; X=In, Sc, Yb, Fe; and Y=Mg, Zn, Ni; doped with $MnO_2$ (0.0-2.5 mol %), CuO (0.0-0.5 wt %).

In an exemplary embodiment, a textured piezoelectric ceramic composition is represented as x $Pb(X_{1/2}Nb_{1/2})O_3$-y $Pb(Y_{1/3}Nb_{2/3})O_3$-(1−x−y) $PbTiO_3$ (PIN-PMN-PT), wherein x=0.20-0.27 and y=0.40-0.45; X=In, Sc, Yb, Fe; and Y=Mg, Zn, Ni; doped with $MnO_2$ (0.0-2.5 mol %), CuO (0.0-0.5 wt %); and modified using a 0.0-5 vol % $BaTiO_3$ template.

In an exemplary embodiment, a textured piezoelectric ceramic composition is represented as x $Pb(X_{1/2}Nb_{1/2})O_3$-y $Pb(Y_{1/3}Nb_{2/3})O_3$-(1−x−y) $PbTiO_3$ (PIN-PMN-PT), wherein x=0.20-0.27 and y=0.40-0.45; X=In, Sc, Yb, Fe; and Y=Mg, Zn, Ni; doped with $MnO_2$ (0.0-2.5 mol %), CuO (0.0-0.5 wt %); modified using a 0.0-5 vol % $BaTiO_3$ template and exhibiting Lotgering factor from 0 to 100%.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages and possible applications of the present invention will be more apparent from the following more particular description thereof, presented in conjunction with the following drawings. It should be understood that like reference numbers used in the drawings may identify like components.

FIG. 1 shows a flow diagram for exemplary methods for generating a piezoelectric ceramic.

Figure 2:
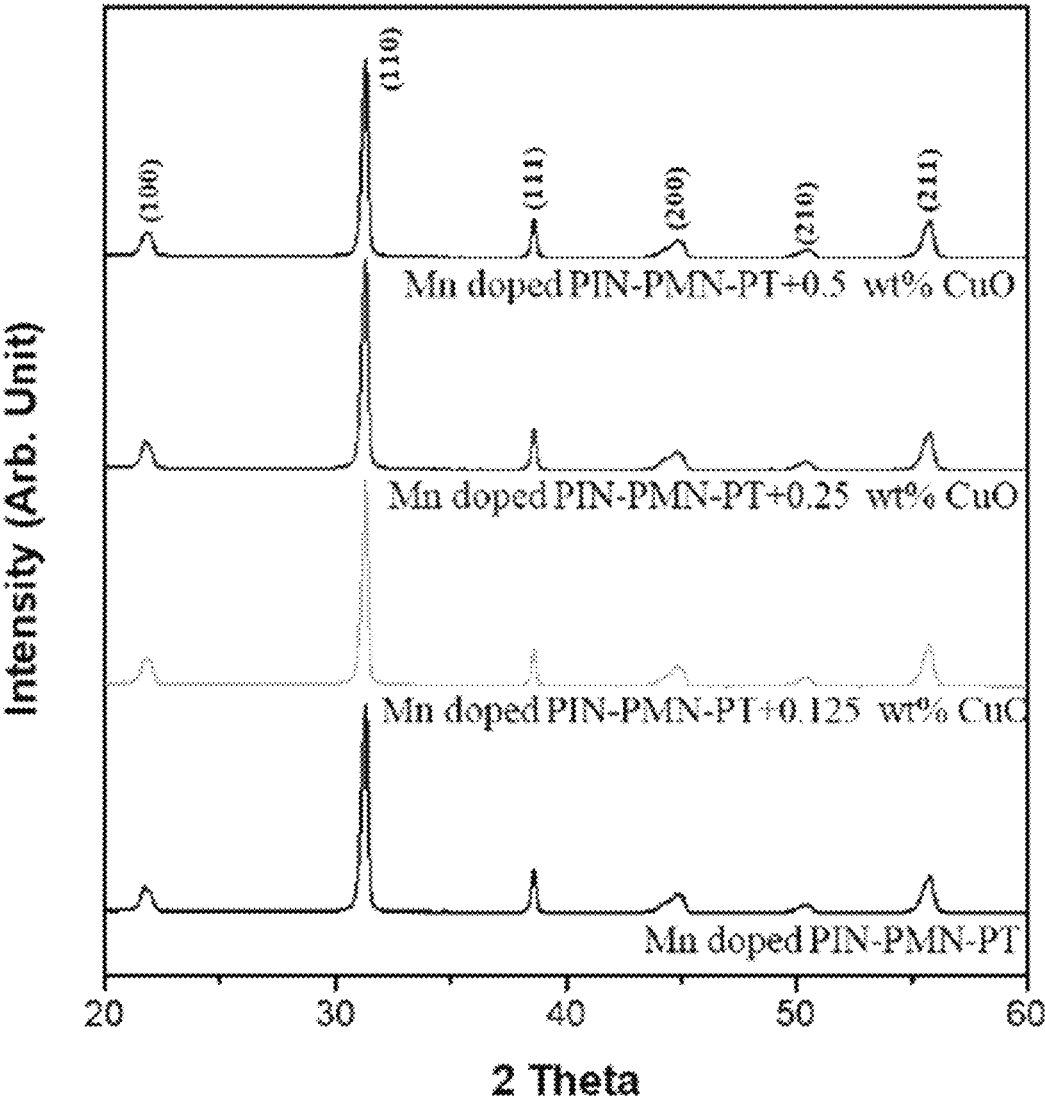

FIG. 2 shows XRD patterns of Mn doped PIN-PMN-PT ceramics with different CuO contents.

Figure 3:
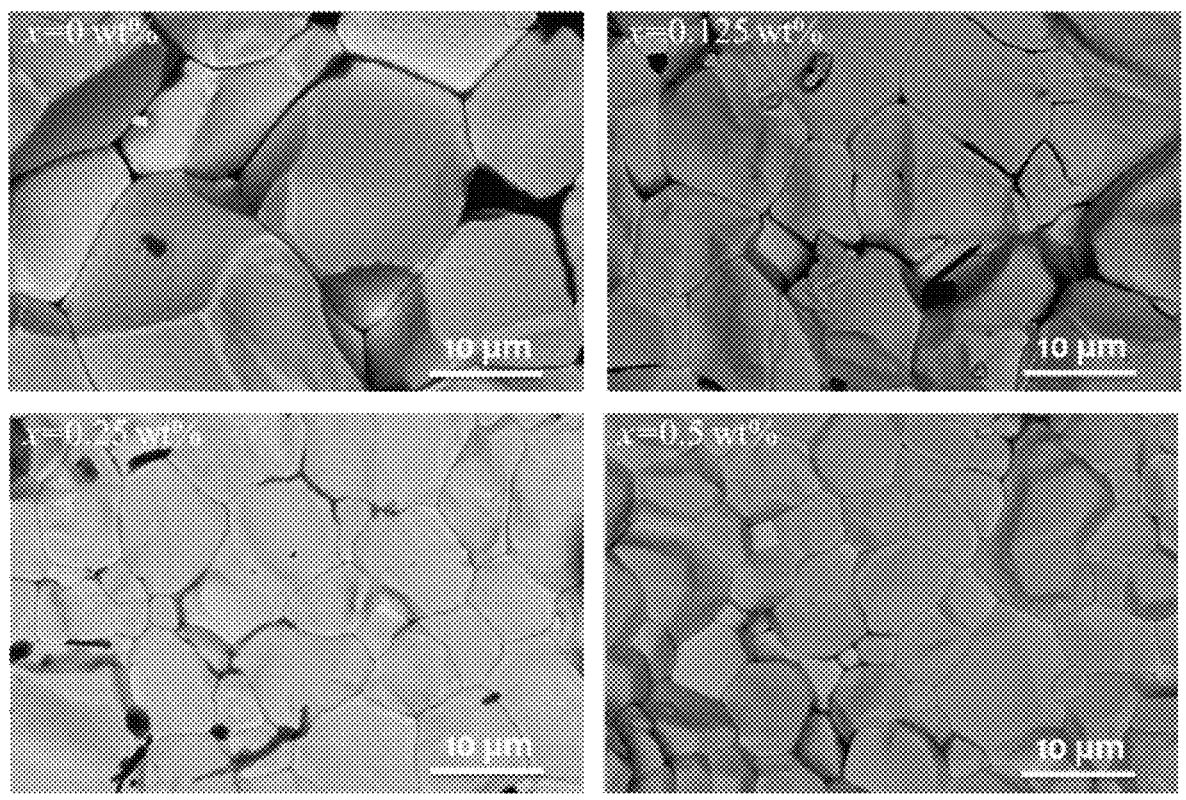

FIG. 3 shows SEM micrographs of Mn doped PIN-PMN-PT ceramics with different CuO contents (x).

Figure 4:
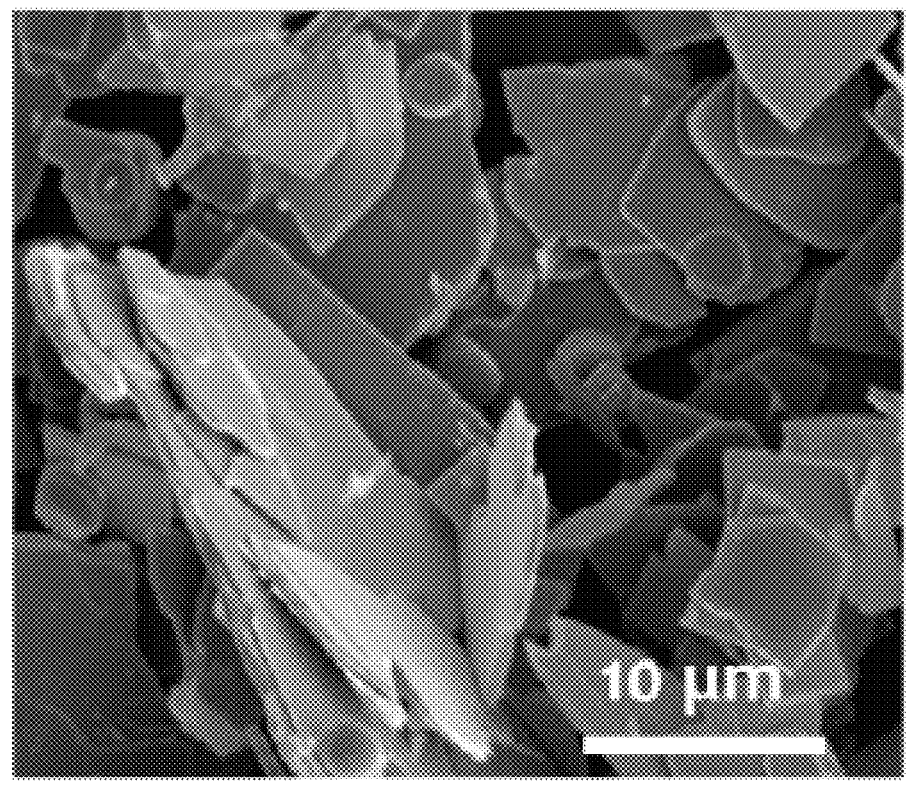

FIG. 4 shows SEM images of $Bi_4Ti_3O_{12}$.

Figure 5:
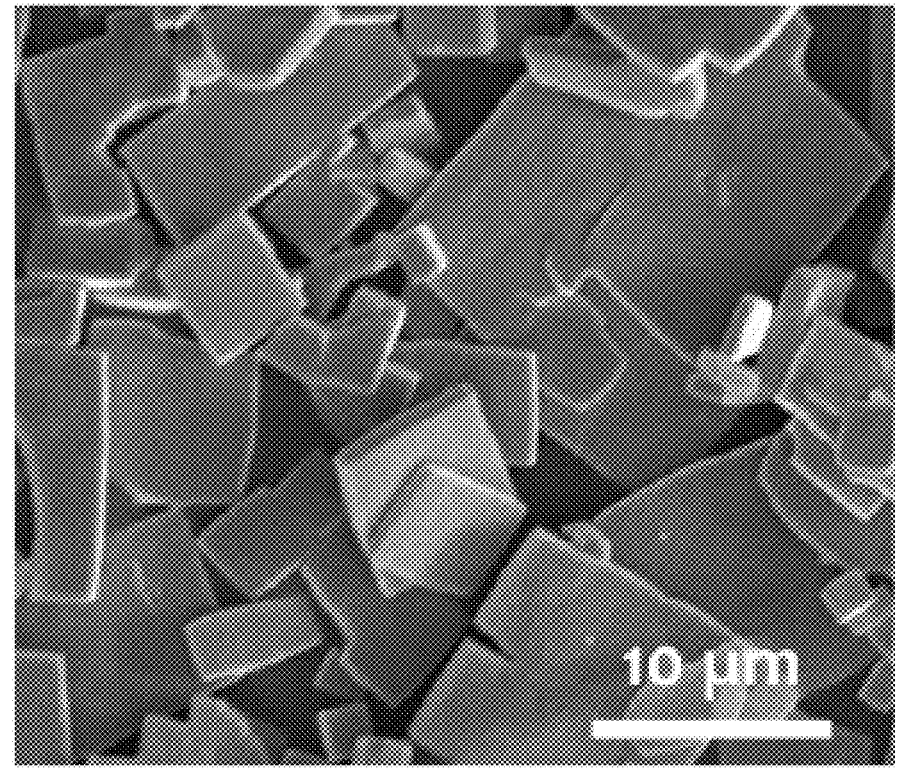

FIG. 5 shows SEM images of $BaTiO_3$.

Figure 6:
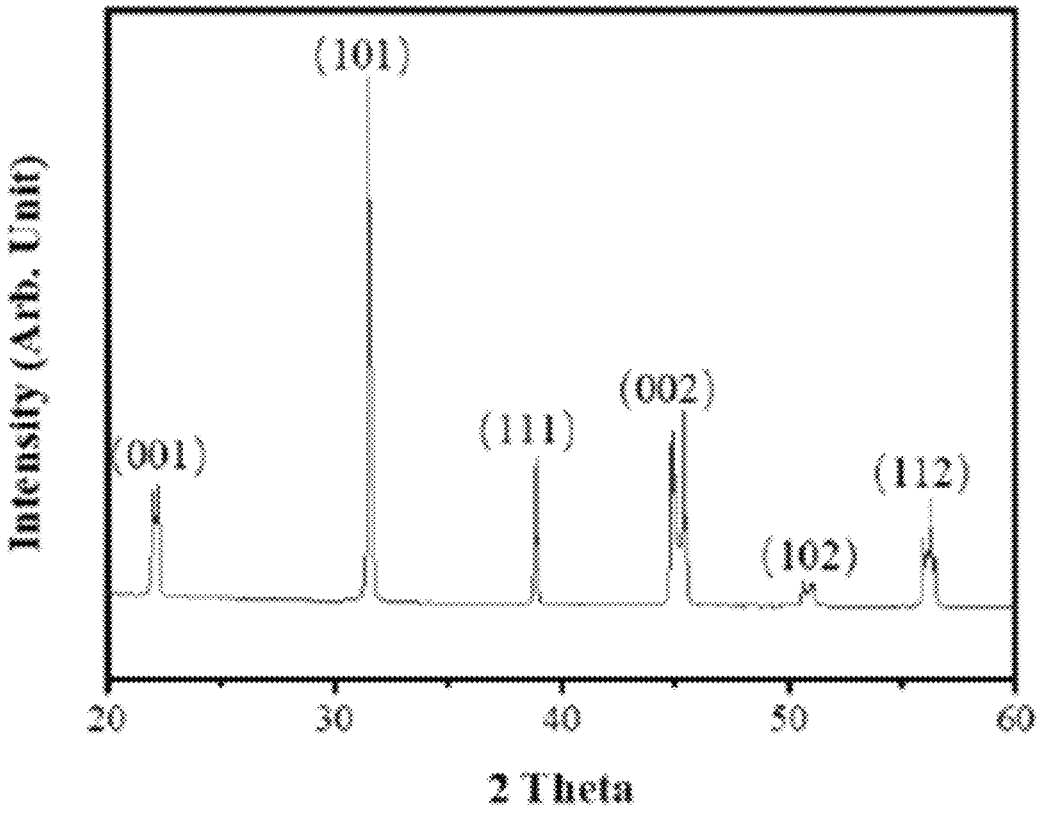

FIG. 6 shows XRD pattern of the $BaTiO_3$ templates.

Figure 7:
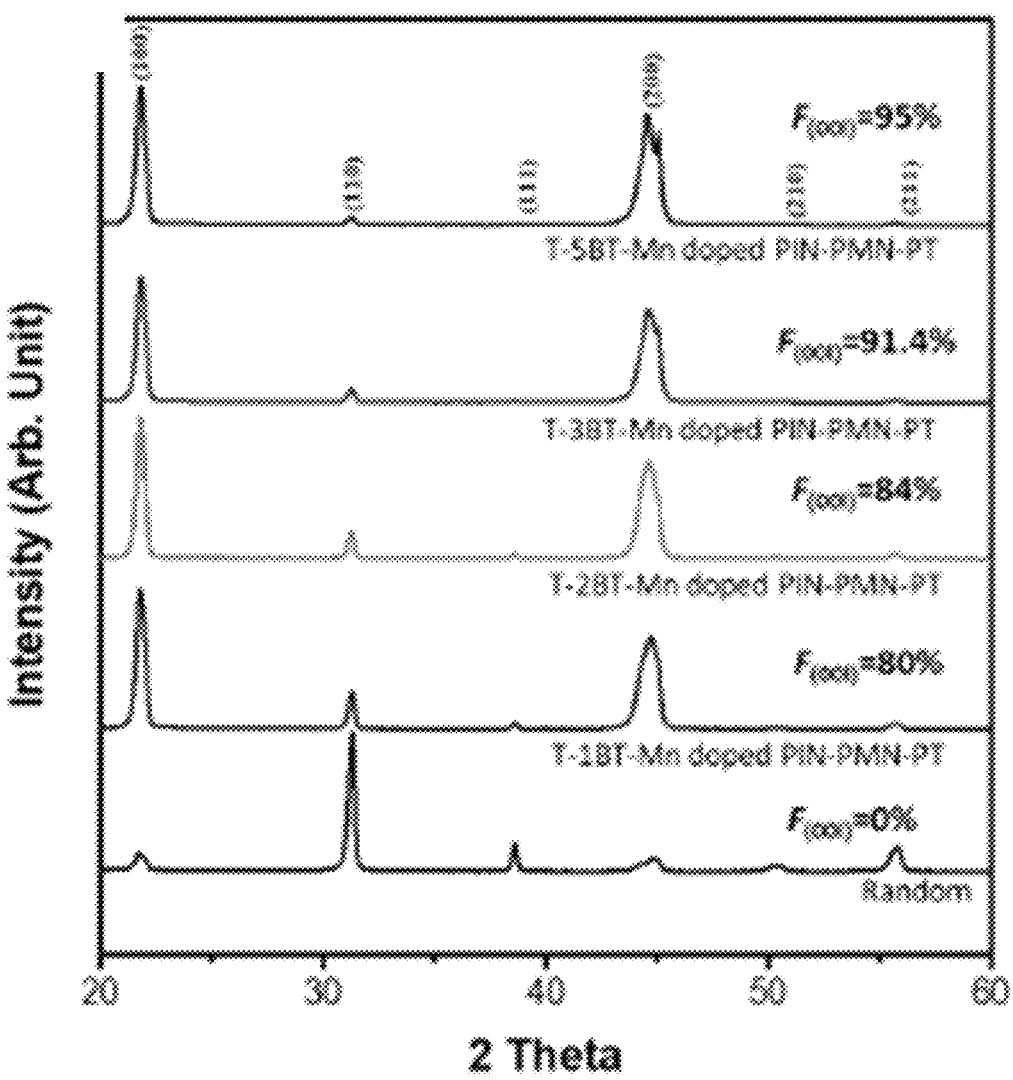

FIG. 7 shows XRD patterns of Mn doped PIN-PMN-PT-xBT ceramics.

Figure 8:
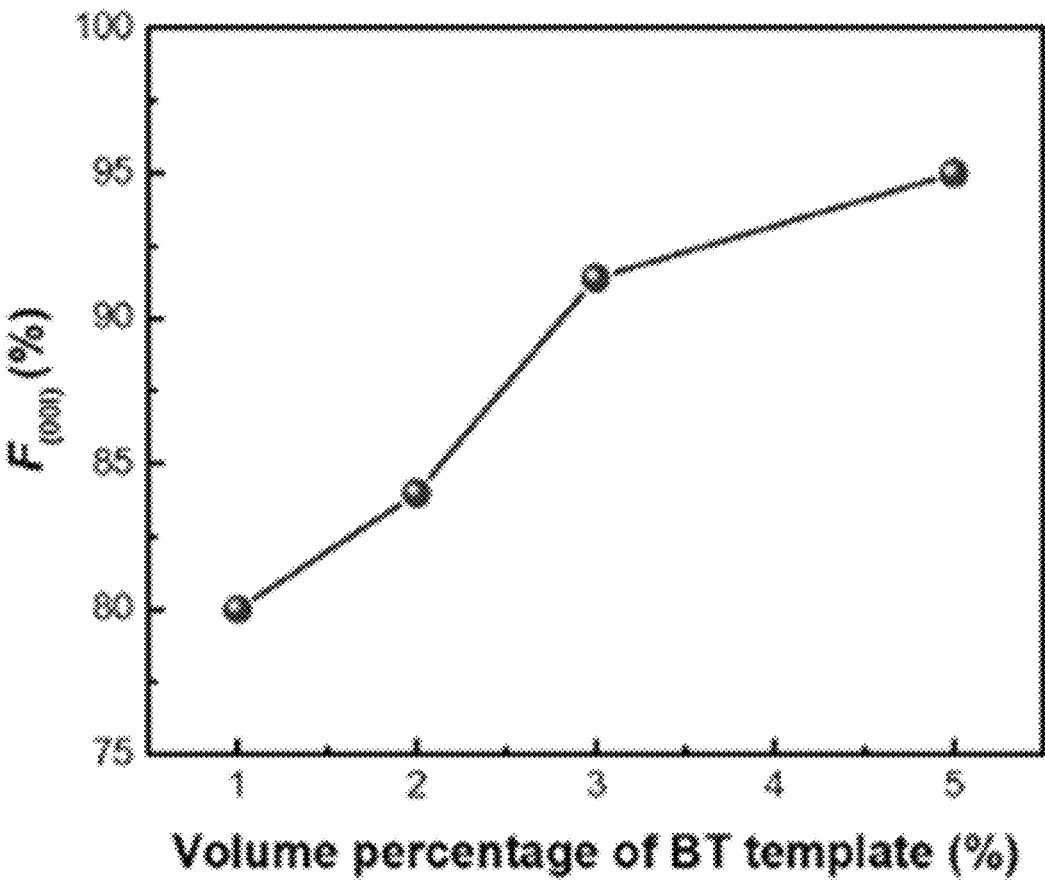

FIG. 8 shows texture degree $F_{(00l)}$ as a function of BT template content.

Figure 9:
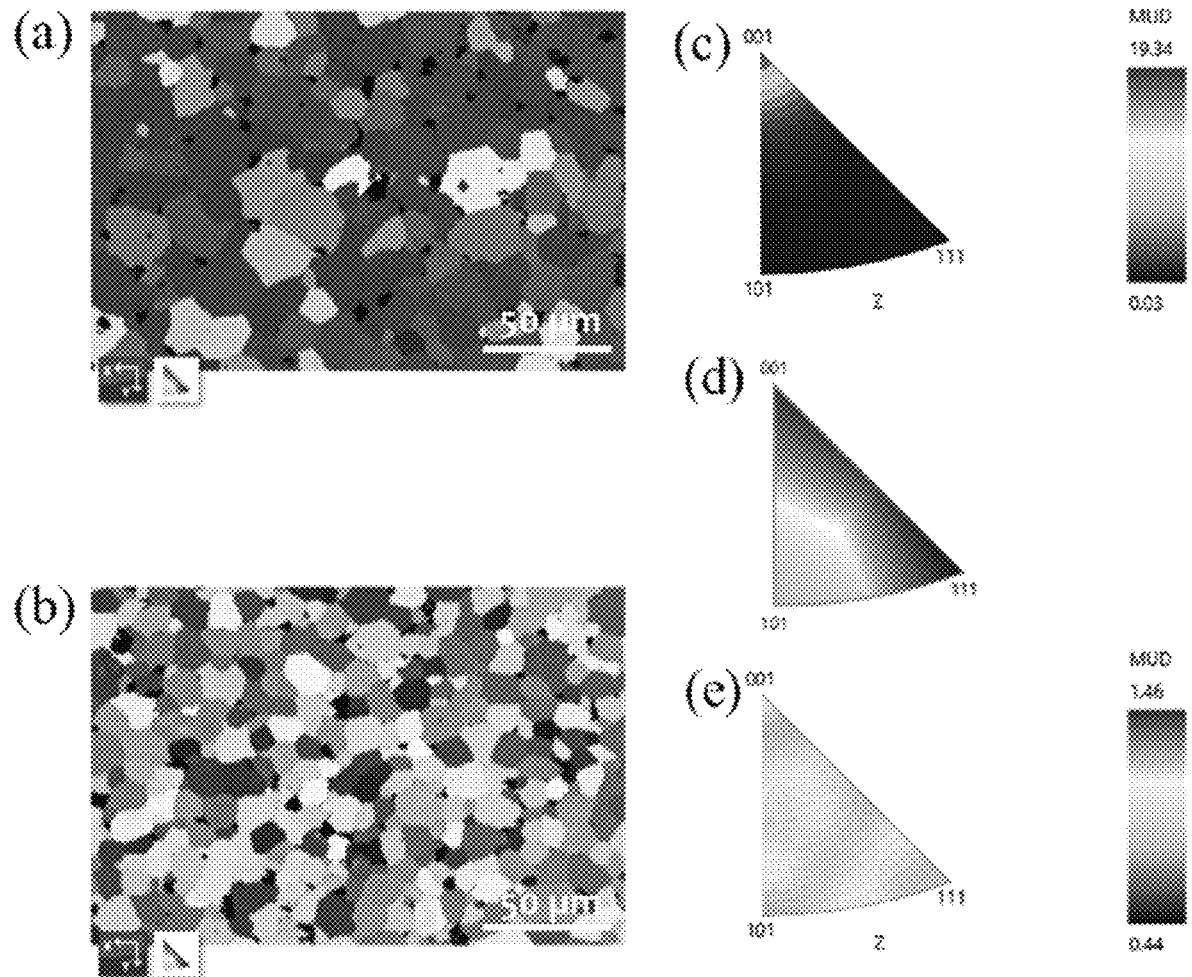

FIG. 9 shows EBSD images of: (a) Mn doped PIN-PMN-PT-3BT; (b) Mn doped PINPMN-PT-0BT ceramics; (c) and (e) the inversed pole figures with MUD (multiples uniform pole) data corresponding to (a) and (b), respectively; and (d) the inversed pole figure color key corresponding to (a) and (b).

Figure 10:
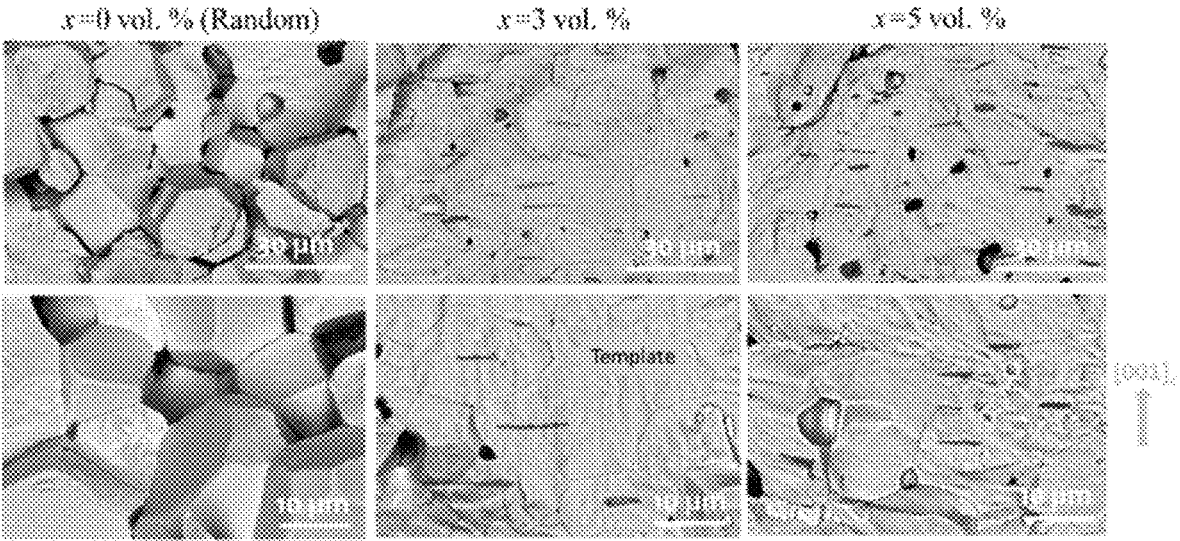

FIG. 10 shows SEM micrographs of Mn doped PIN-PMN-PT-xBT ceramics.

Figure 11:
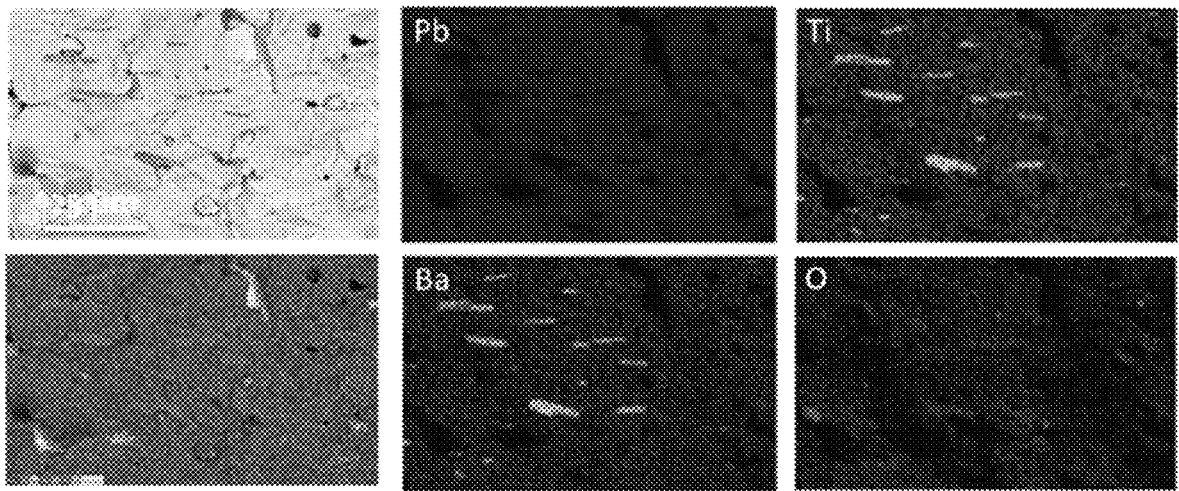

FIG. 11 shows SEM images and EDS element mapping of Mn doped PIN-PMN-PT-3BT ceramic.

Figure 12:
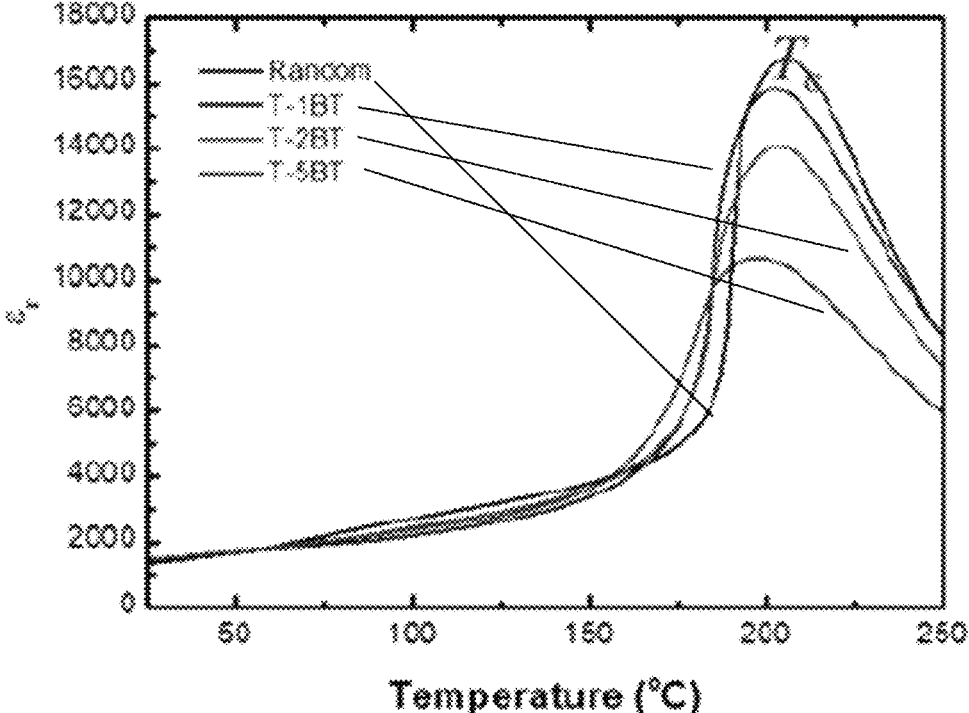

FIG. 12 shows dielectric permittivity for random and textured ceramics.

Figure 13:
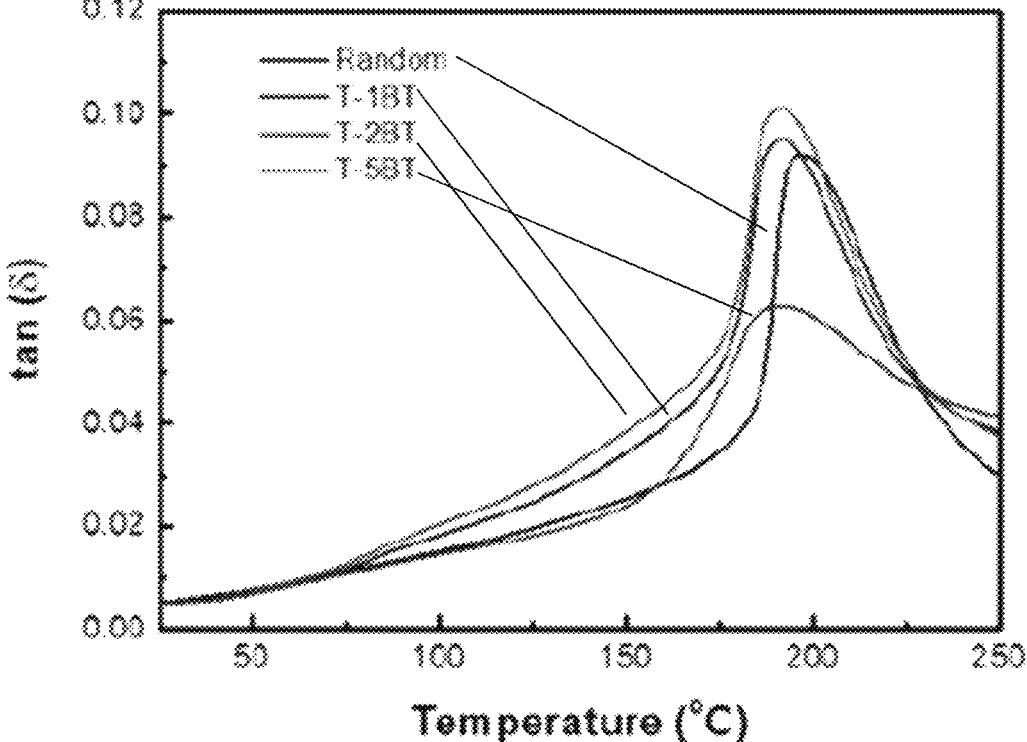

FIG. 13 shows dielectric loss as a function of temperature for random and textured ceramics.

Figure 14:
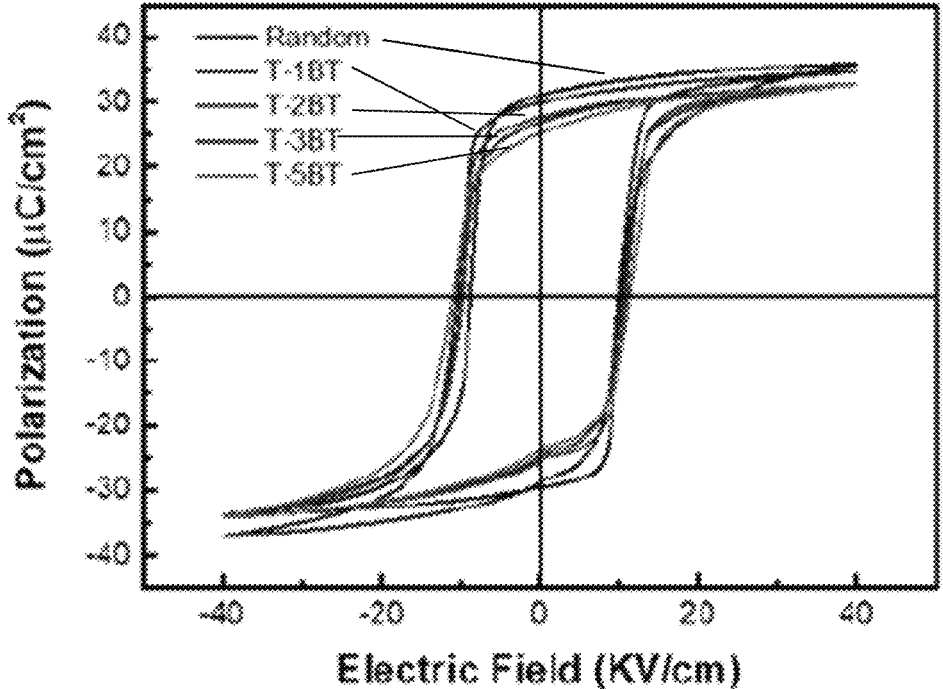

FIG. 14 shows P-E hysteresis loops for random and textured ceramics.

Figure 15:
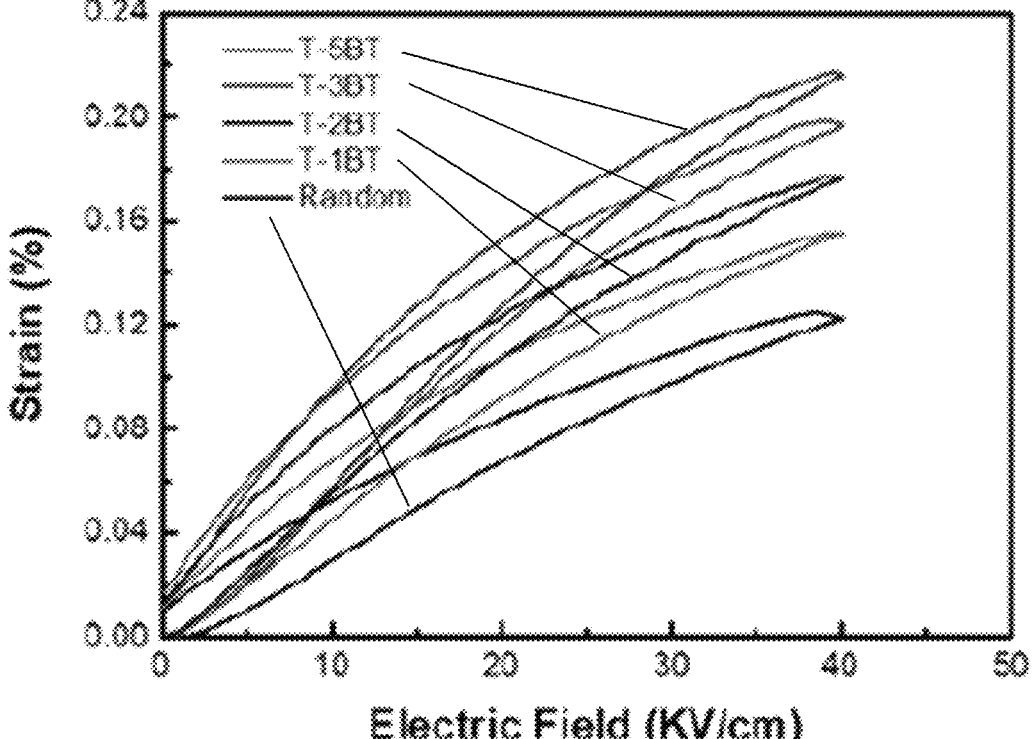

FIG. 15 shows unipolar S-E curves for random and textured ceramics.

Figure 16:
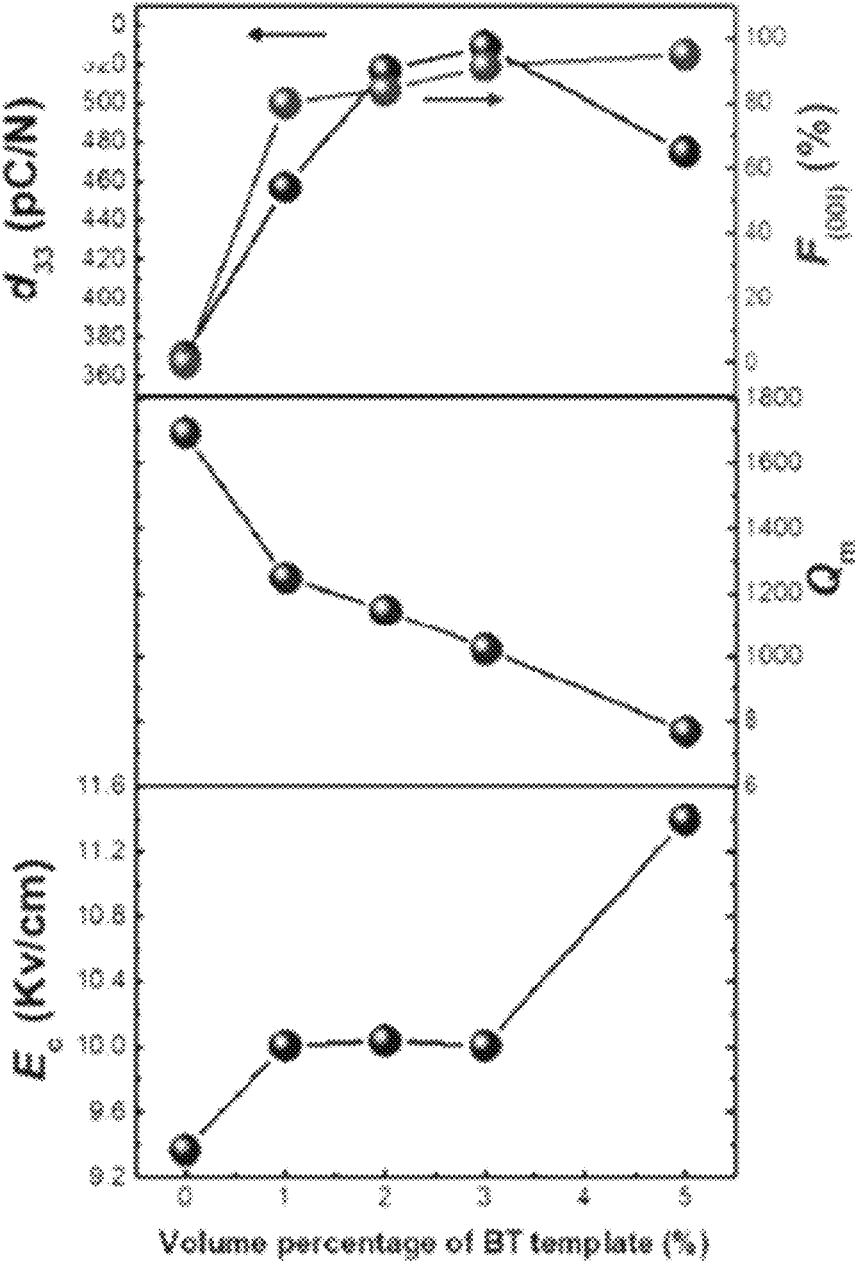

FIG. 16 shows the piezoelectric constant $d_{33}$, mechanical quality factor $Q_m$, and coercive field $E_c$ as a function of BT template content.

Figure 17:
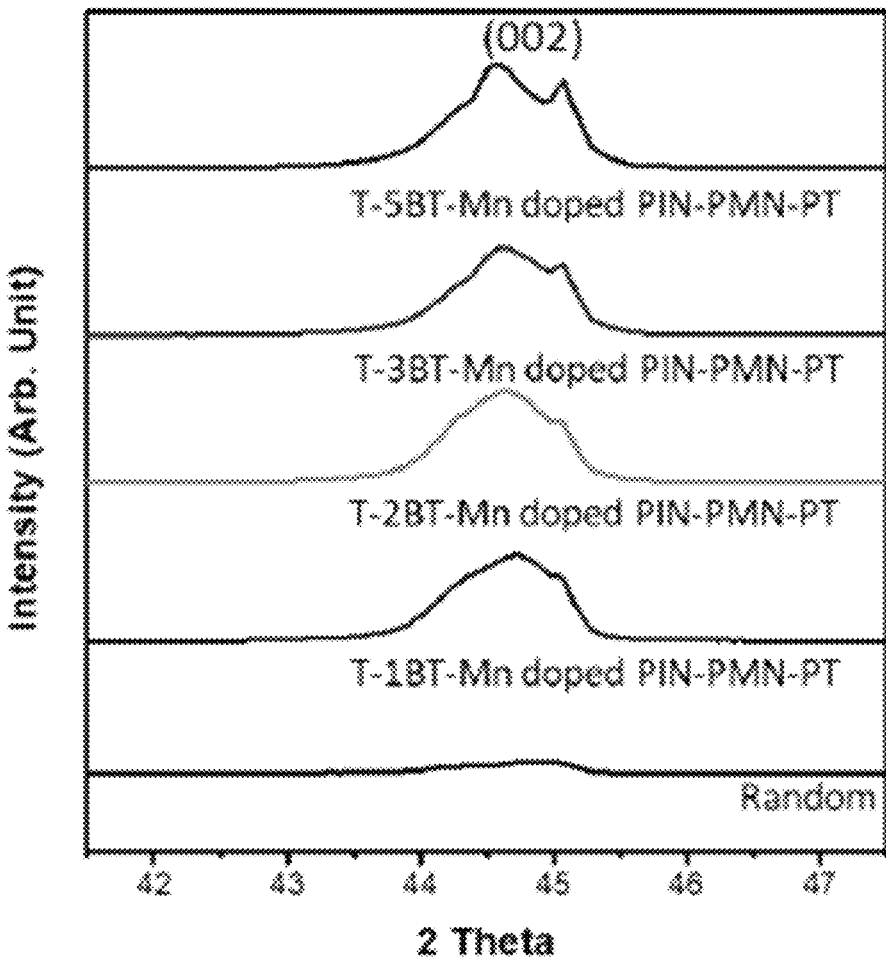

FIG. 17 shows the magnification of XRD patterns of Mn doped PIN-PMN-PT-xBT ceramics in the range from 42° to 47°.

Figure 18:
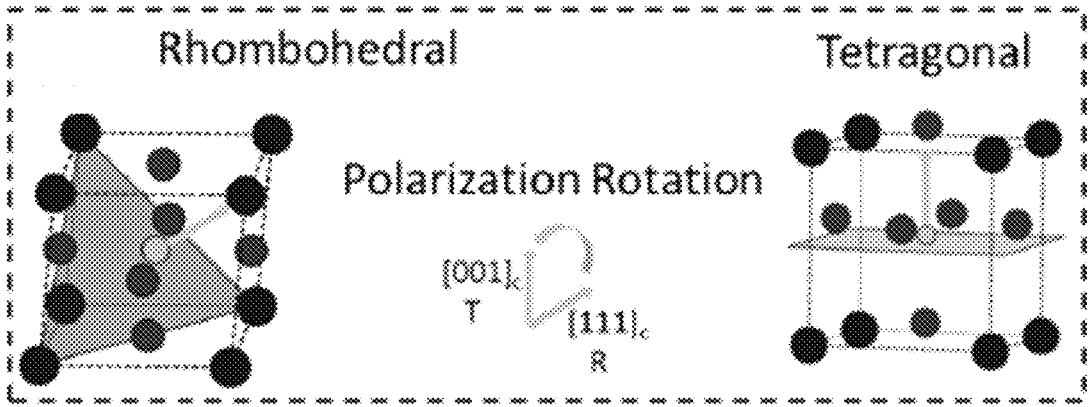

FIG. 18 shows polarization rotation between rhombohedral and tetragonal crystal structure.

Figure 19:
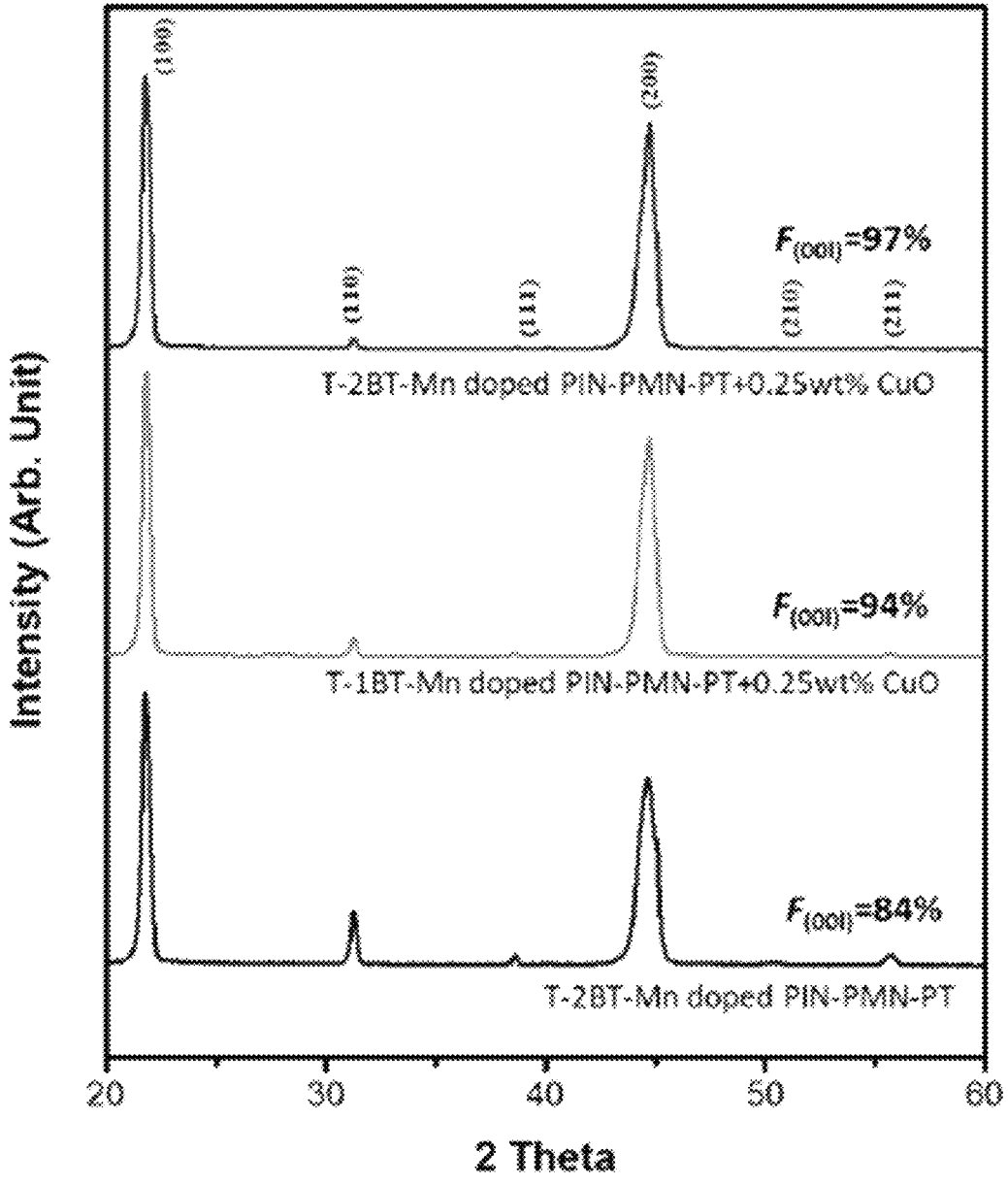

FIG. 19 shows XRD patterns for textured Mn doped PIN-PMN-PT ceramics with different CuO contents.

Figure 20:
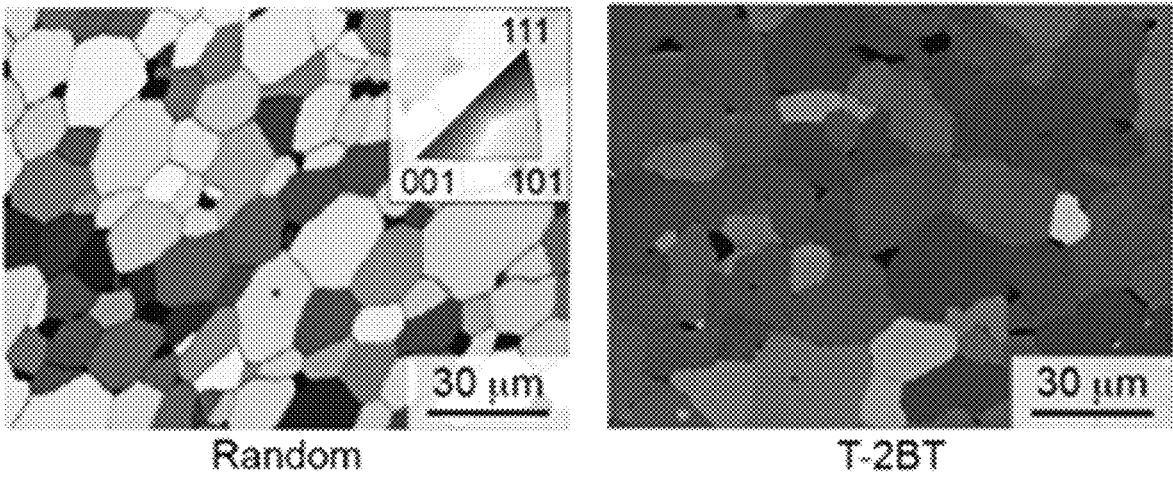

FIG. 20 shows EBSD images of random and textured Mn doped PIN-PMN-PT-2BT with 0.25 wt % CuO (T-2BT) ceramics.

Figure 21:
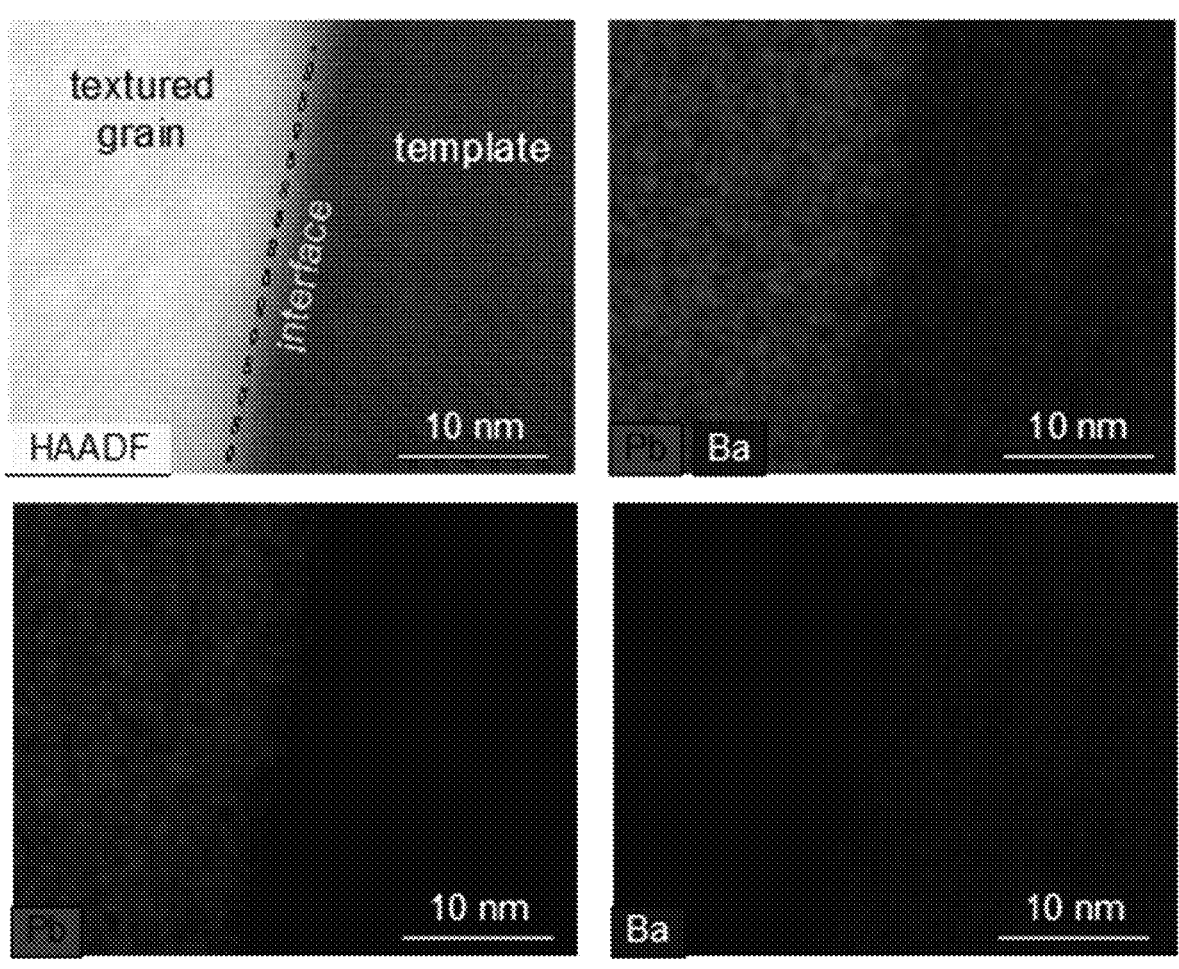

FIG. 21 shows STEM image and the corresponding EDS element mapping of textured Mn doped PIN-PMN-PT-2BT with 0.25 wt % CuO (T-2BT) ceramic.

Figure 22:
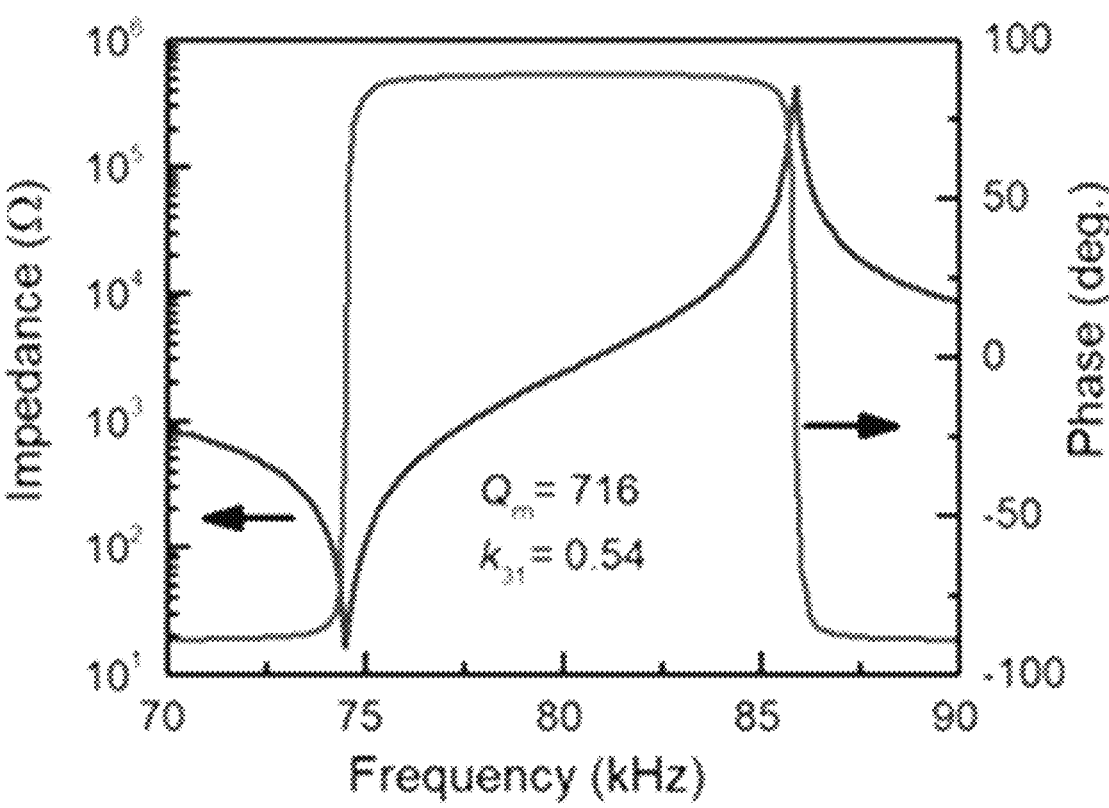

FIG. 22 shows impedance and phase angle spectra for textured Mn doped PIN-PMN-PT-2BT with 0.25 wt % CuO (T-2BT) ceramic.

Figure 23:
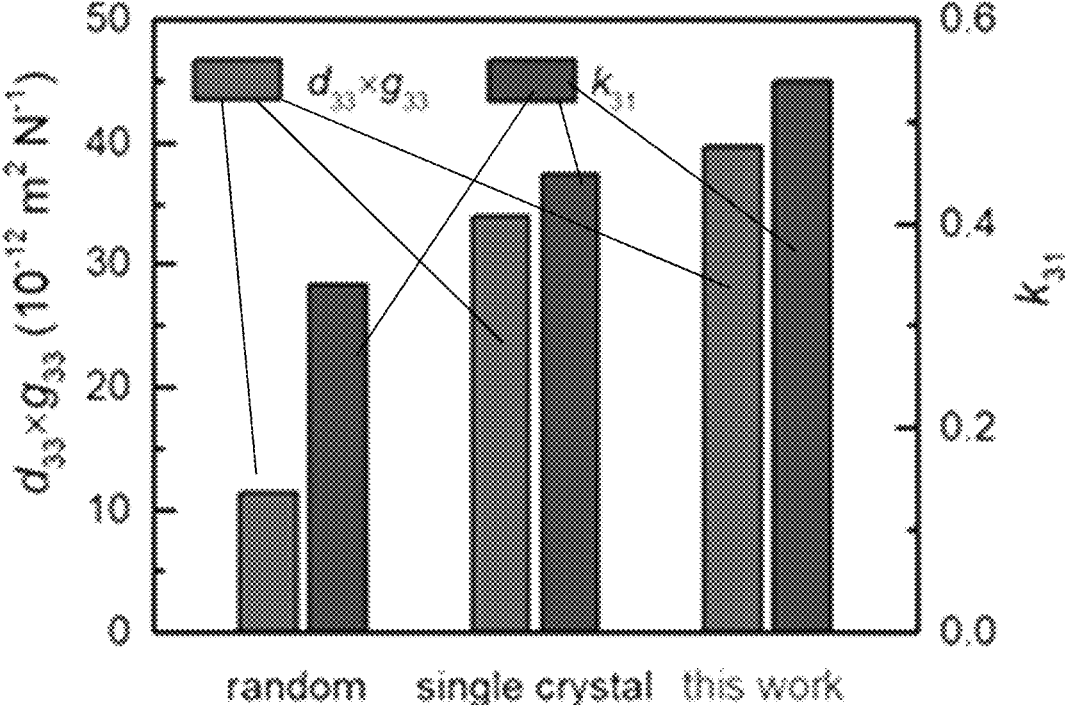

FIG. 23 shows comparation of piezoelectric figure of merit $d_{33} \times g_{33}$ and $k_{31}$ for random, Mn doped PIN-PMN-PT single crystal and textured Mn doped PIN-PMN-PT-2BT with 0.25 wt % CuO (T-2BT) ceramics.

Figure 24:
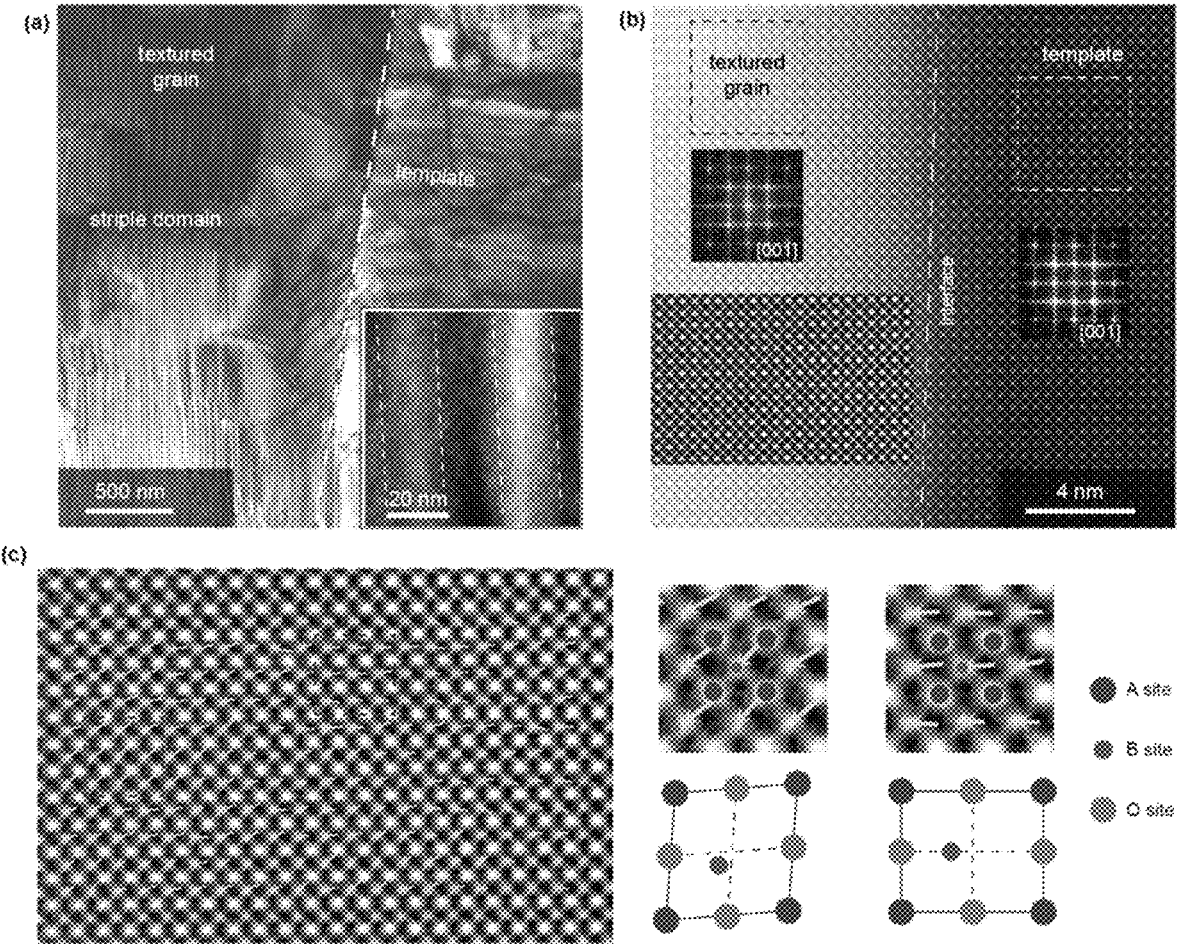

FIG. 24 shows microstructures of textured Mn doped PIN-PMN-PT-2BT with 0.25 wt % CuO (T-2BT) ceramic. (a) High-magnification bright field TEM images of ferroelectric domains for T-2BT ceramic and the inset shows nanodomains within the textured grain. (b) Atomic-resolution HAADF-STEM image of the interface between BT template and textured grain with the inset showing the corresponding faster Fourier transform (FFT) patterns. (c) Atomic-resolution STEM image of the region inside the textured grain along <001>, with B-site cation displacement vectors (arrows) map. The enlarged images on the right show the positions for A and B-site atomic columns.

Figure 25:
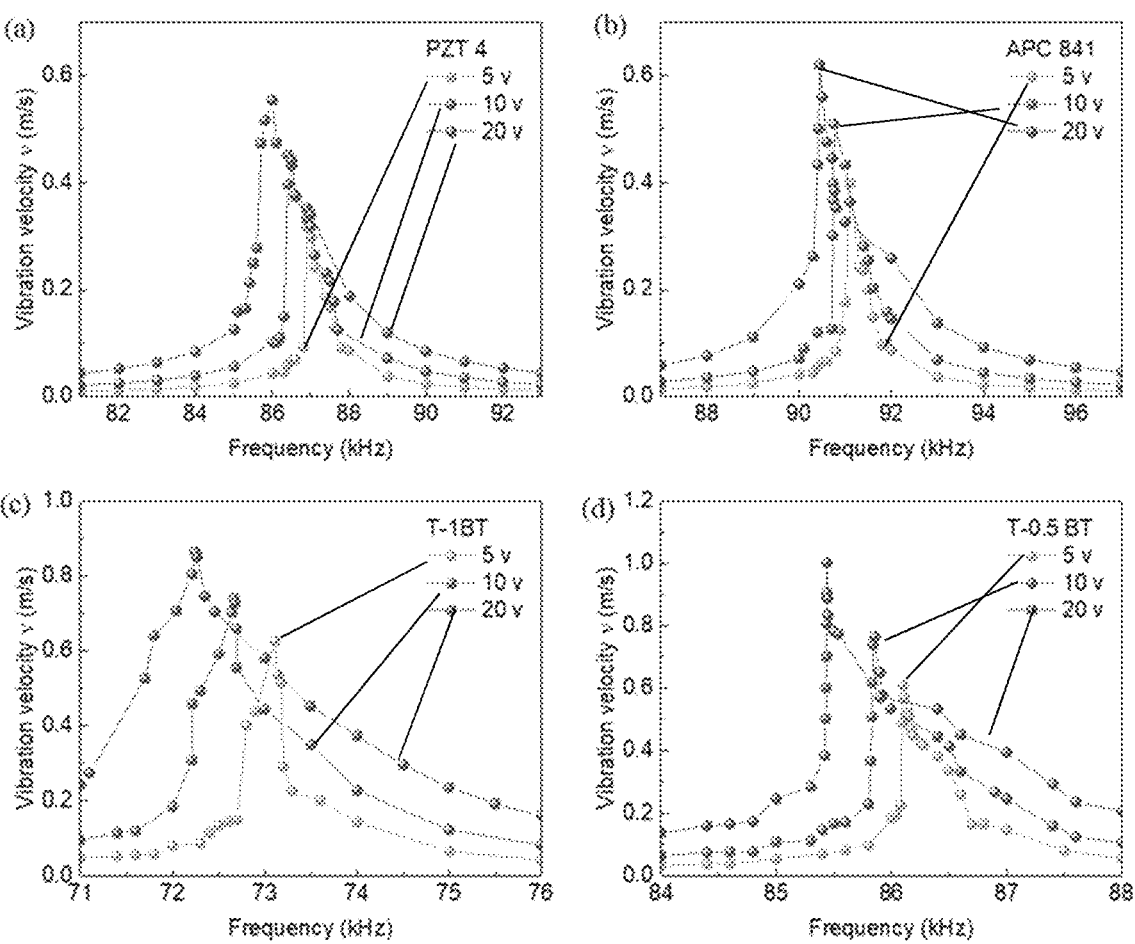

FIG. 25 shows high-power piezoelectric vibration characteristics of commercial hard and textured ceramics. Vibration velocity as a function of the measured frequency under constant voltage condition for (a) commercial hard PZT 4, (b) commercial hard APC 841, (c) textured Mn doped PIN-PMN-PT-1BT with 0.25 wt % CuO (T-1BT), and (d) textured Mn doped PIN-PMN-PT-0.5BT with 0.25 wt % CuO (T-0.5BT) ceramics.

Figure 26:
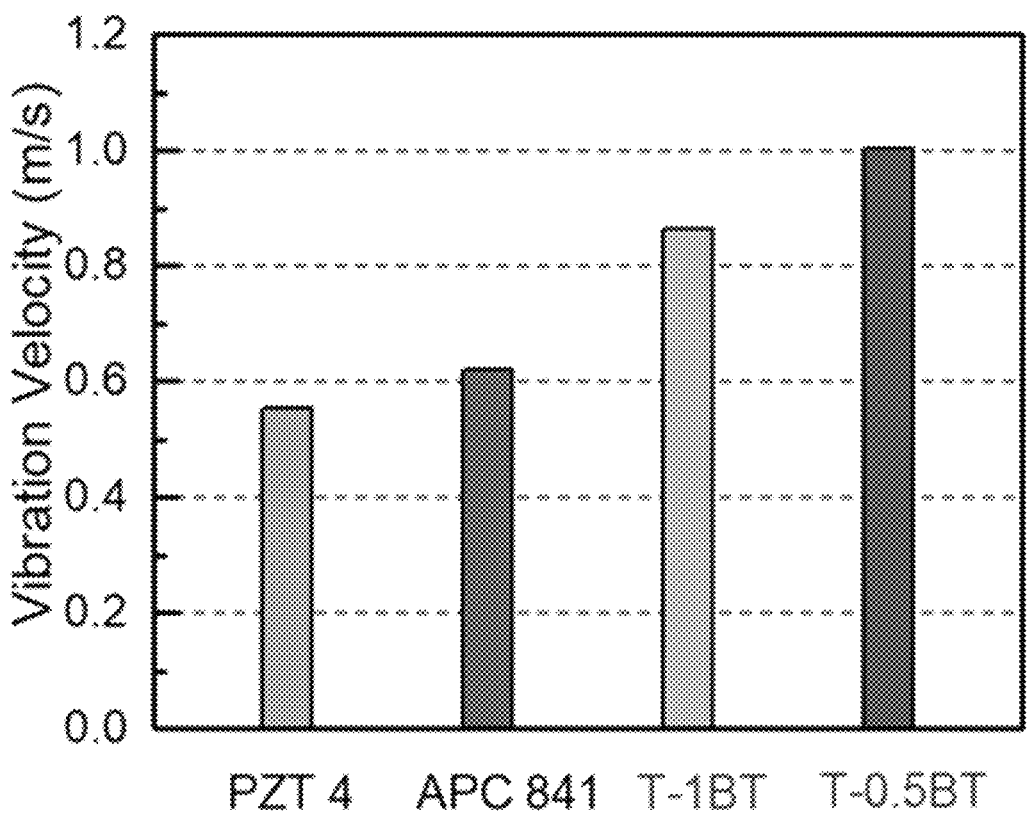

FIG. 26 shows comparison of maximum vibration velocities for commercial hard PZT 4, commercial hard APC 841, textured Mn doped PIN-PMN-PT-1BT with 0.25 wt % CuO (T-1BT), and textured Mn doped PIN-PMN-PT-0.5BT with 0.25 wt % CuO (T-0.5BT) ceramics.

Figure 27:
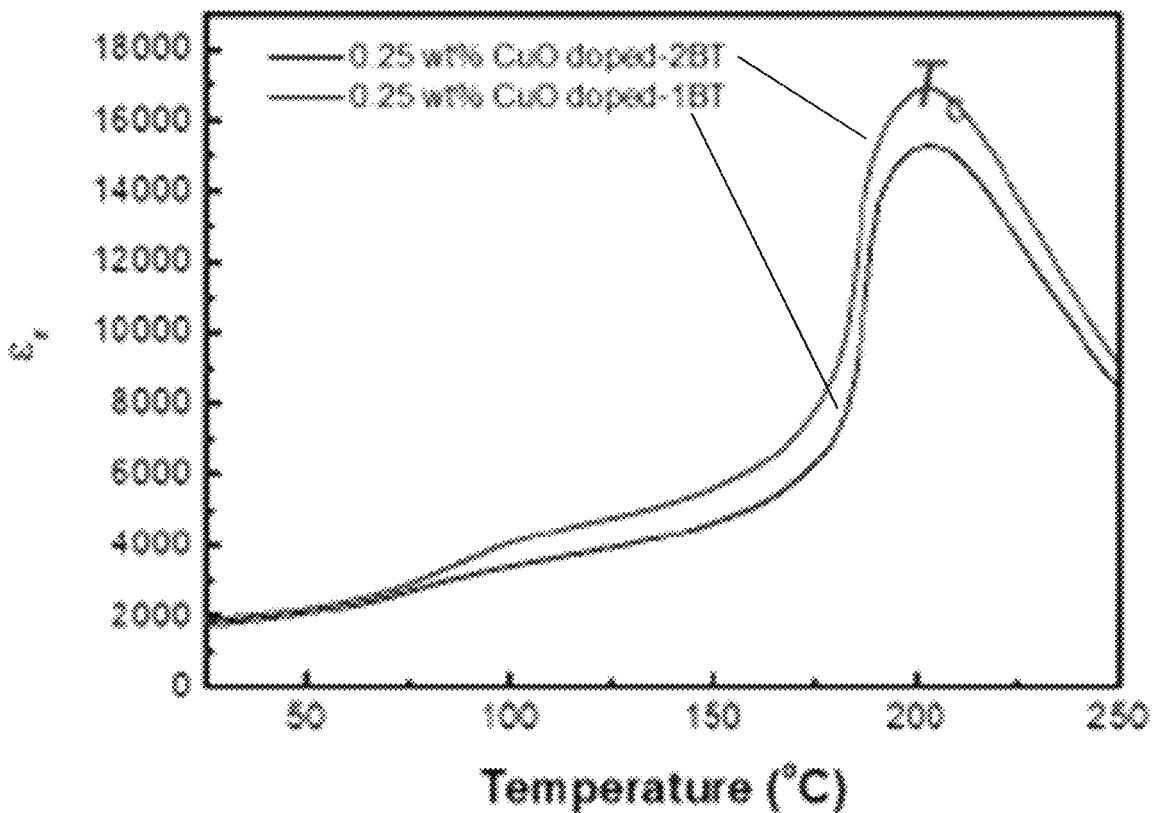

FIG. 27 shows dielectric permittivity curves for textured ceramics with different CuO contents.

Figure 28:
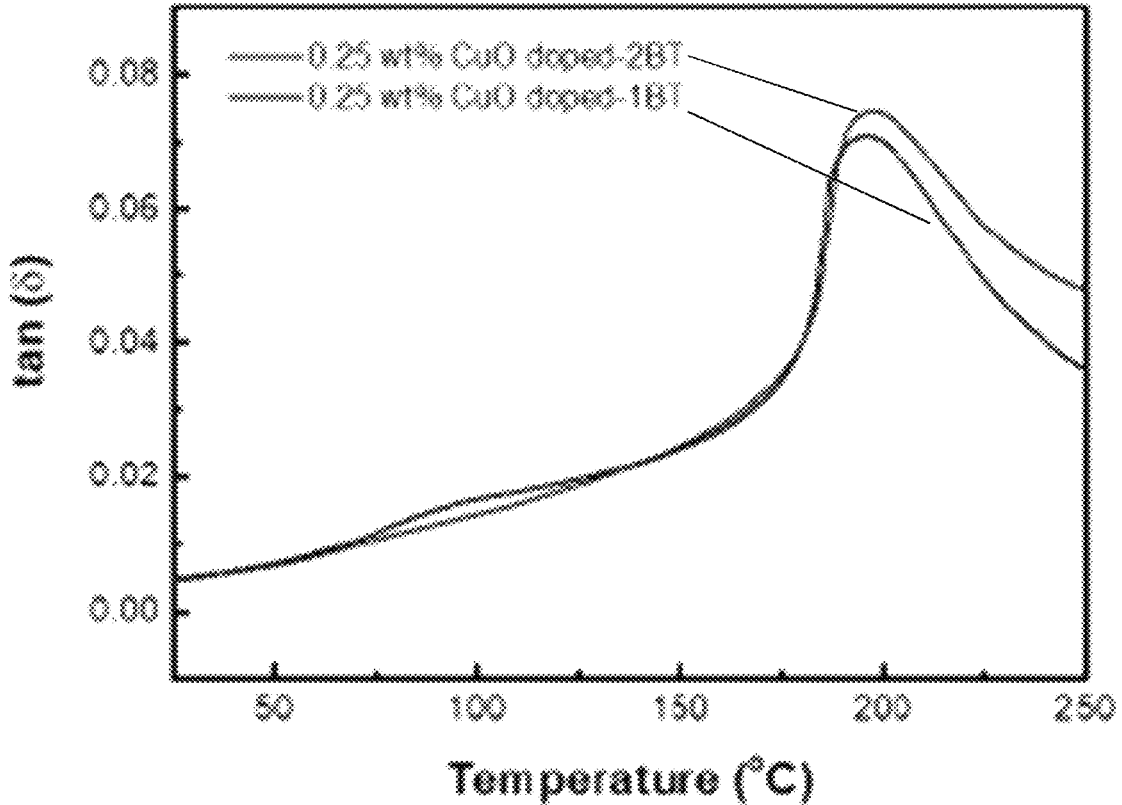

FIG. 28 shows dielectric loss as a function of temperature for textured ceramics with CuO content.

Figure 29:
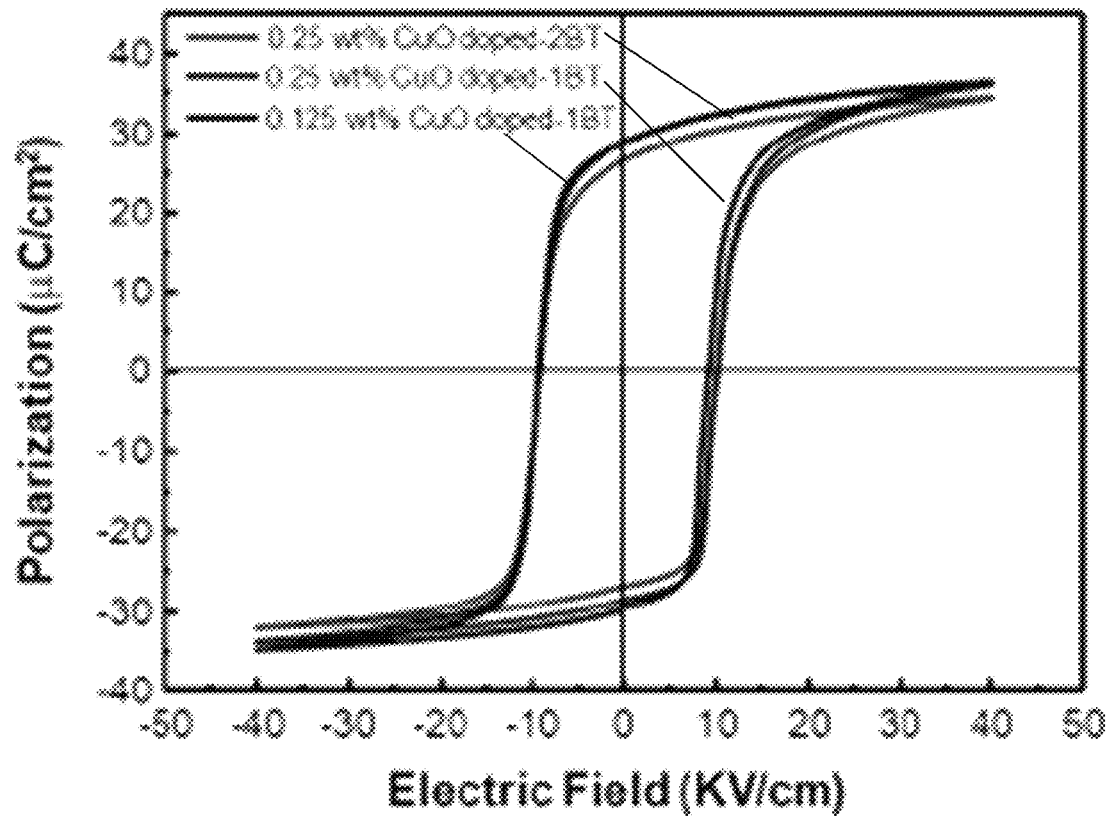

FIG. 29 shows P-E hysteresis loops for random and textured ceramics with different CuO contents.

Figure 30:
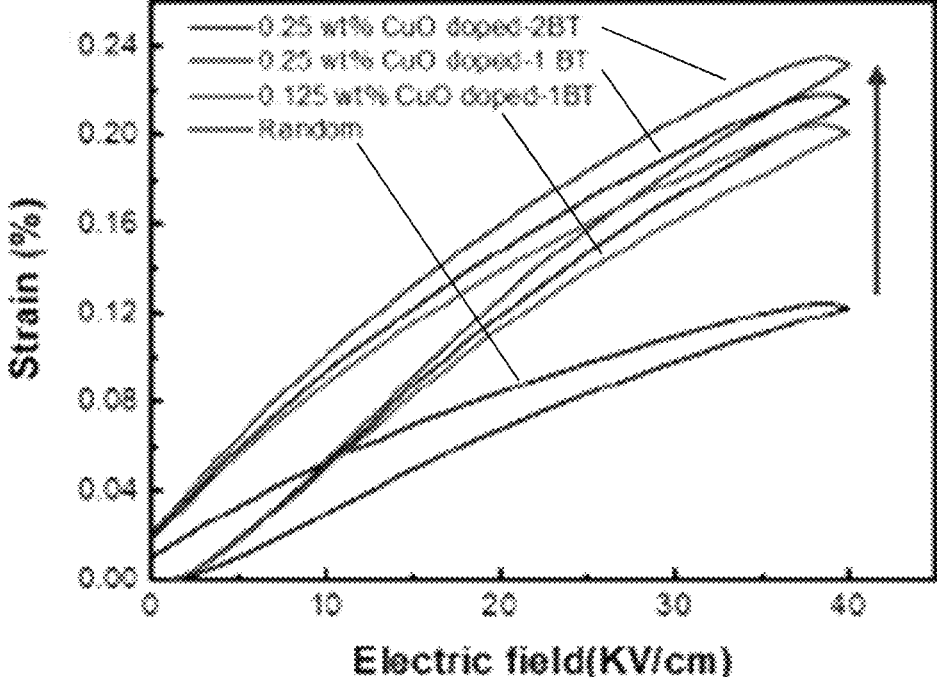

FIG. 30 shows unipolar S-E for random and textured ceramics with different CuO contents.

Figure 31:
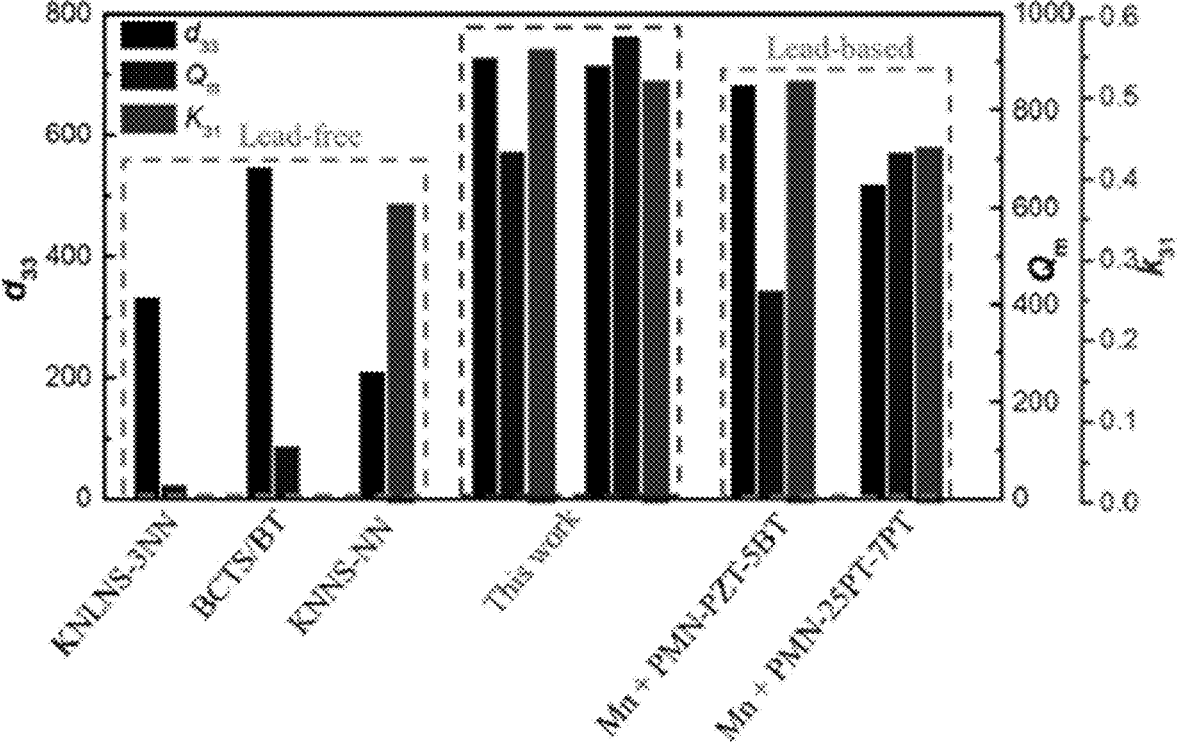

FIG. 31 shows a comparison of $d_{33}$, $k_{31}$, and $Q_m$ in representative textured lead-free/lead-based piezoelectric ceramics.

Figure 32:
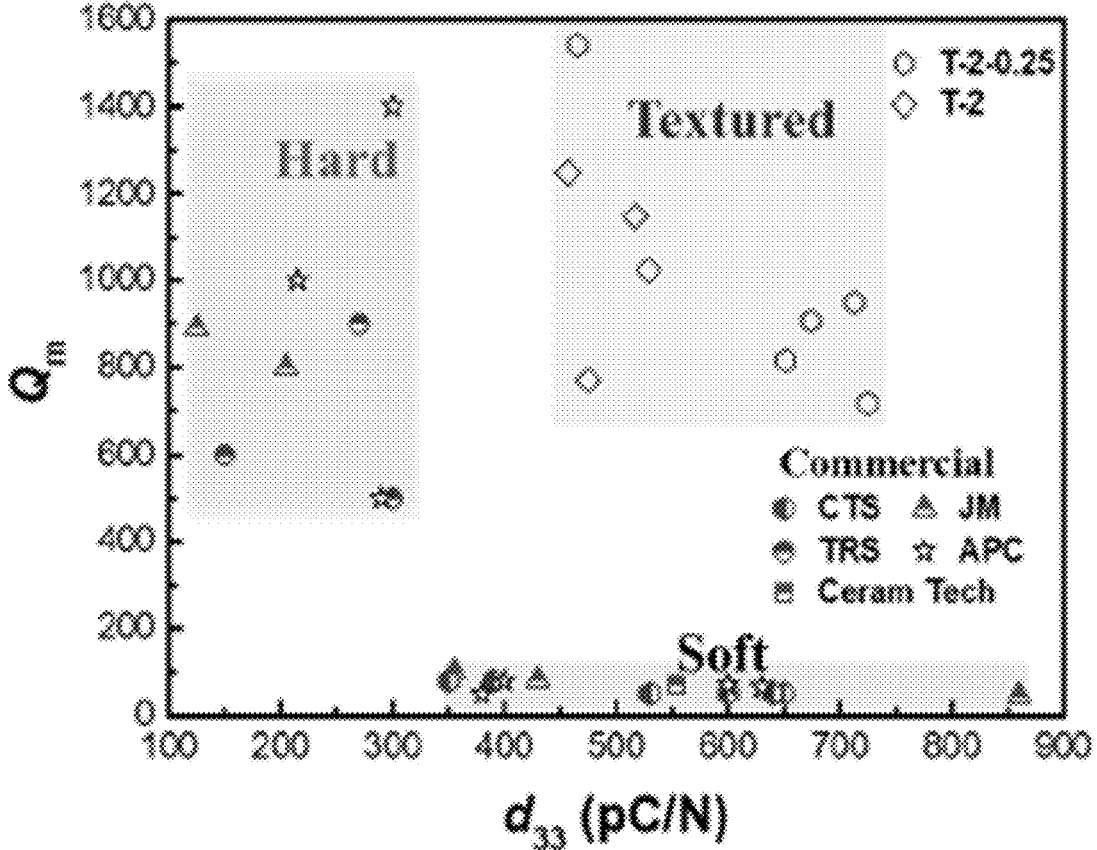

FIG. 32 shows $Q_m$ and $d_{33}$ of developed high-power textured ceramics, compared to commercial hard and soft-type piezoelectric ceramics (Textured: High-power textured piezoceramics; T-2-0.25: Textured-2 mol % Mn doped PIN-PMN-PT+0.25 wt % CuO; T-2: Textured-2 mol % Mn doped PIN-PMN-PT).

Figure 33:
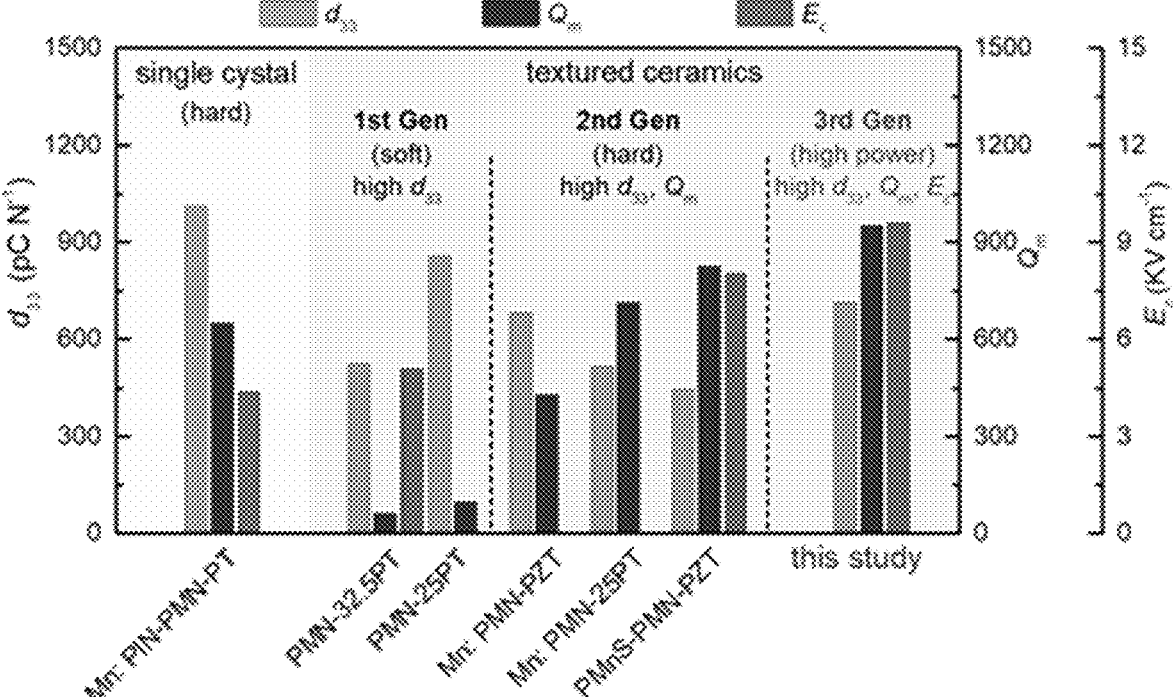

FIG. 33 shows comparison of relevant parameters ($d_{33}$, $Q_m$, $E_c$) in representative textured piezoelectric ceramics and Mn-doped PIN-PMN-PT single crystal.

Figure 34:
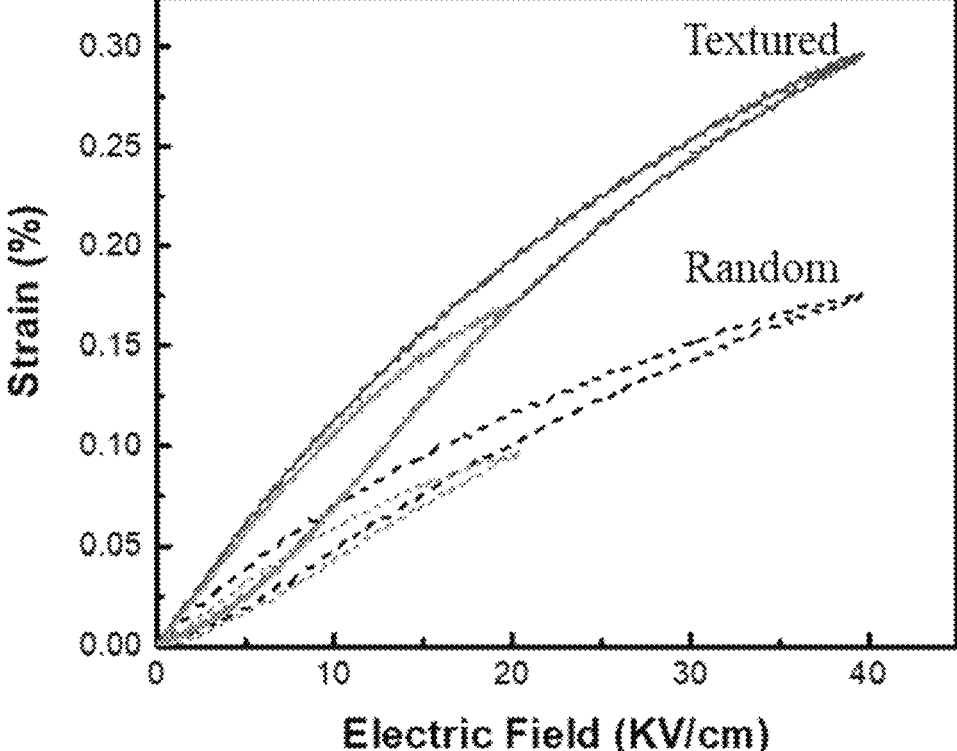

FIG. 34 shows unipolar S-E curves for random and textured 0.25 wt % CuO-2 mol. % Mn doped 0.16PIN-0.51PMN-0.33PT-5BT (MC-doped 0.16PIN-0.51PMN-0.33PT-5BT) ceramics.

Figure 35:
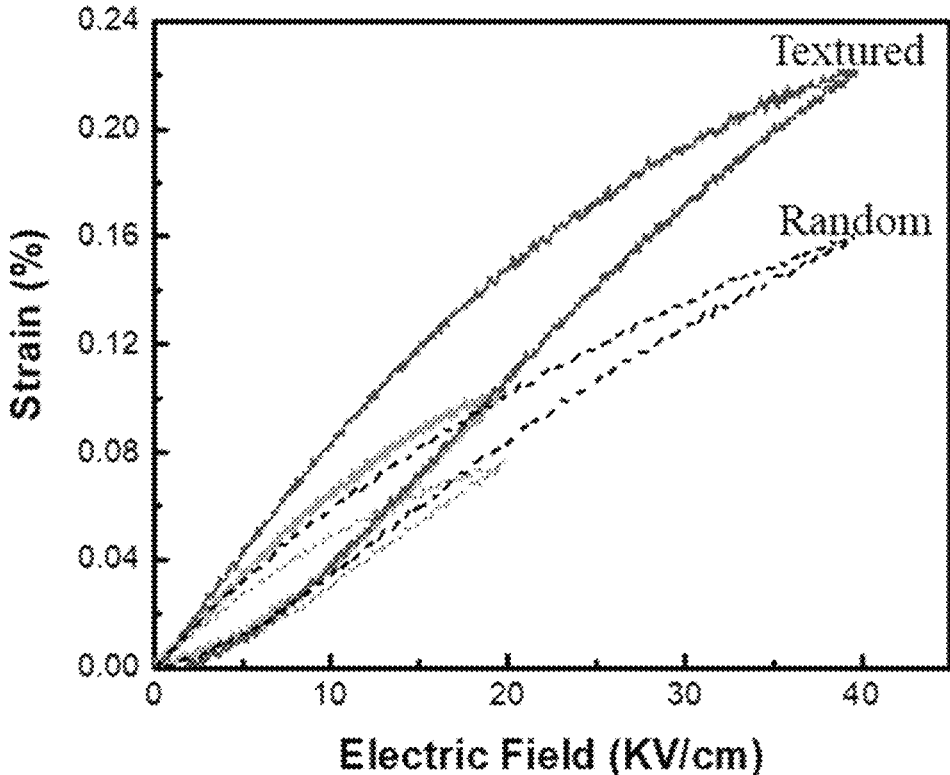

FIG. 35 shows unipolar S-E curves for random and textured 0.25 wt % CuO-2 mol. % Mn doped 0.28PIN-0.40PMN-0.32PT-5BT (MC-doped 0.28PIN-0.40PMN-0.32PT-5BT) ceramics.

Figure 36:
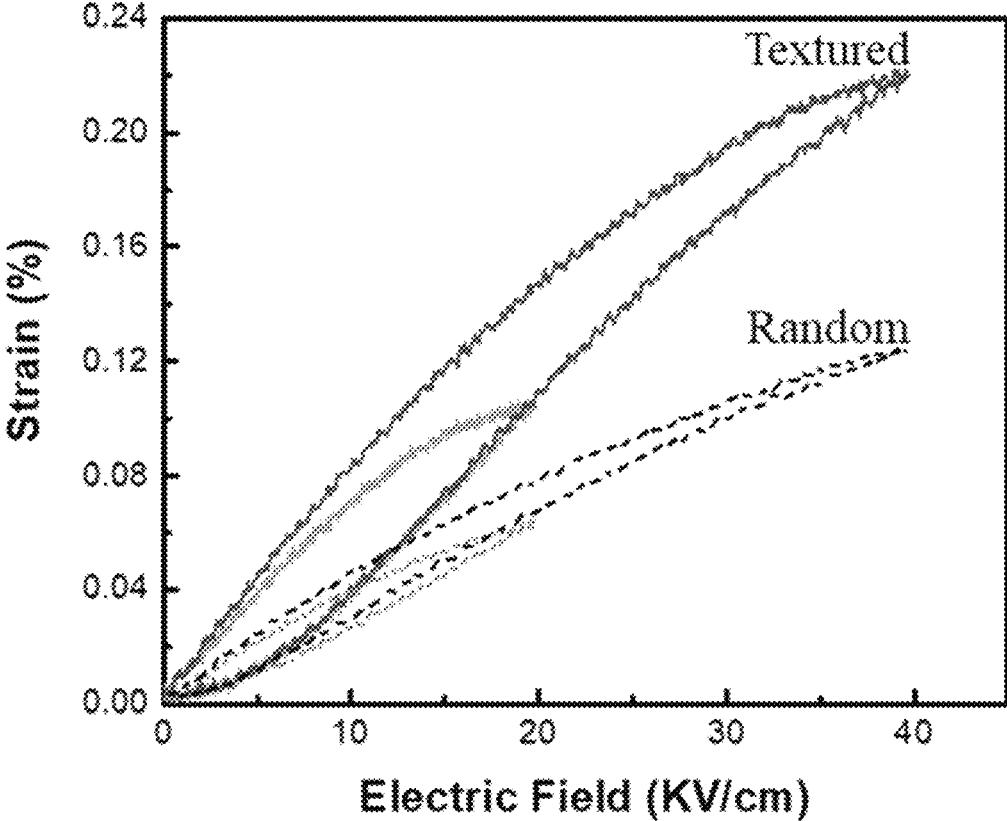

FIG. 36 shows unipolar S-E curves for random and textured 0.25 wt % CuO-2 mol. % Mn doped 0.36PIN-0.30PMN-0.34PT-5BT (MC-doped 0.36PIN-0.30PMN-0.34PT-5BT) ceramics.

Figure 37:
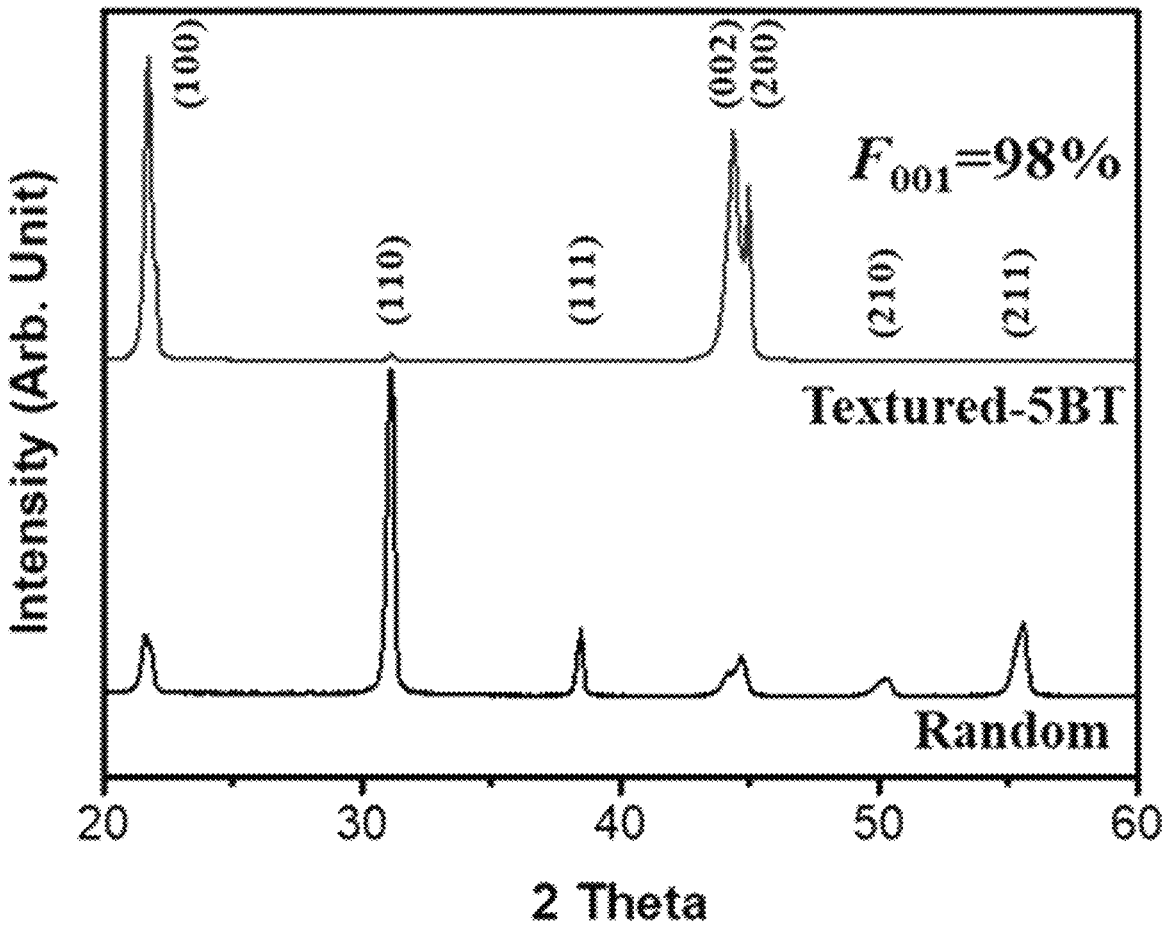

FIG. 37 shows XRD patterns of random and textured 1 mol. % Mn doped 0.25PbZrO3-0.35PbTiO3-0.36Pb(Mg1/3Nb2/3)O3-0.04Pb(Zn1/3Nb2/3)O3 (0.6PZT-0.36PMN-0.04PZN) ceramics.

Figure 38:
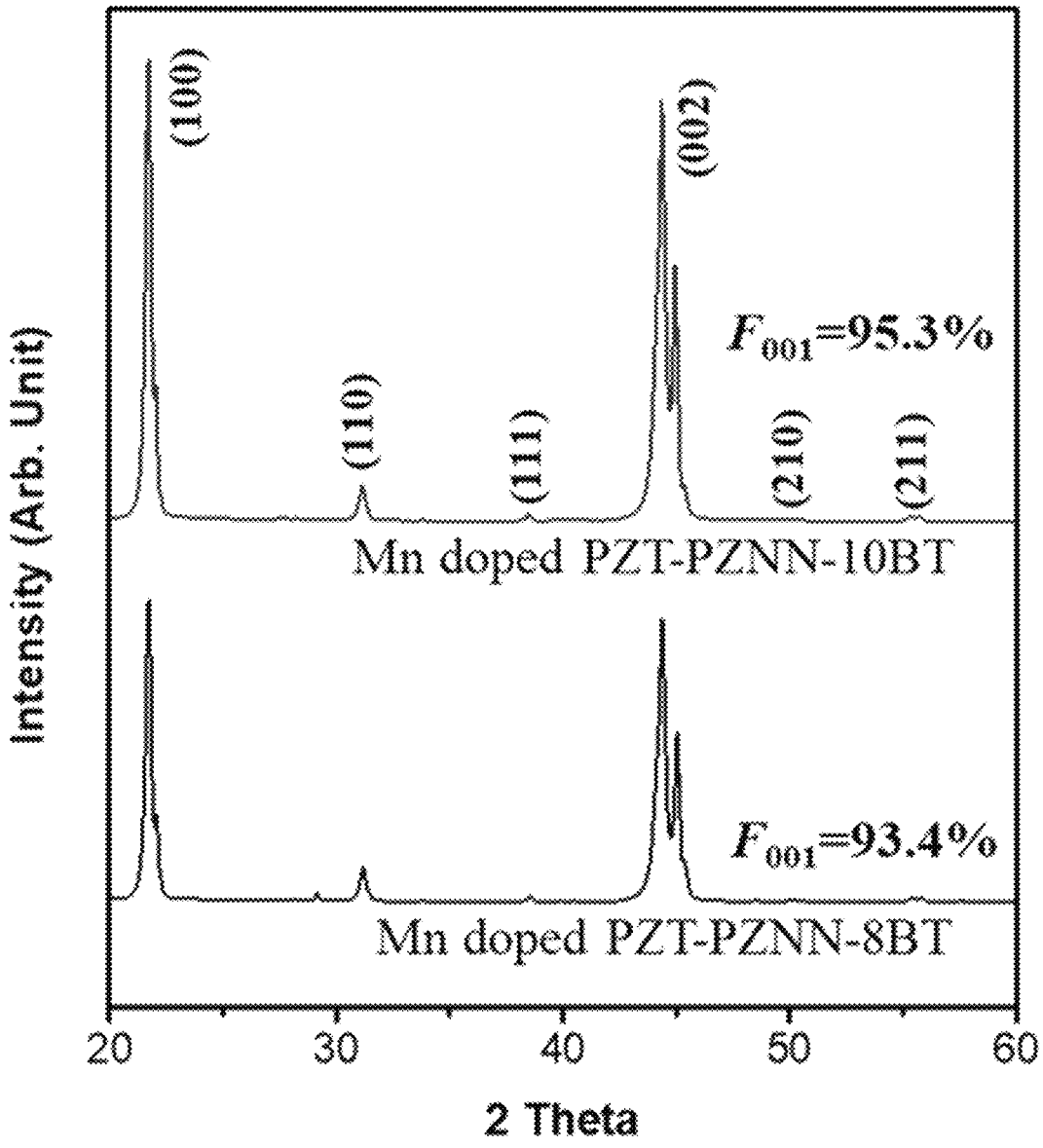

FIG. 38 shows XRD patterns of textured 1 mol. % Mn doped 0.6Pb(Zr0.445Ti0.555)O3-0.4Pb(Zn1/6Ni1/6Nb2/3)O3 (0.6PZT-0.4PZNN) ceramics.

Figure 39:
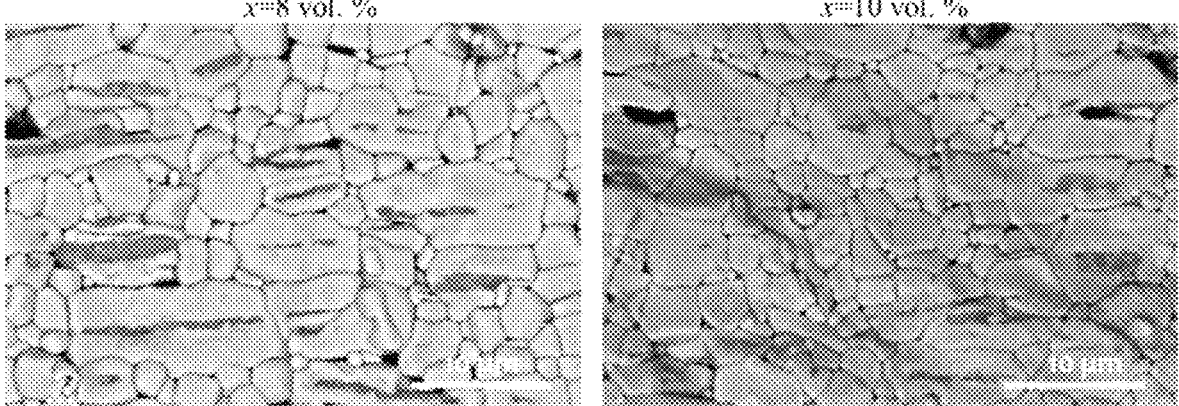

FIG. 39 shows SEM micrographs of textured 1 mol. % Mn doped 0.6PZT-0.4PZNN-xBT ceramics.

Figure 40:
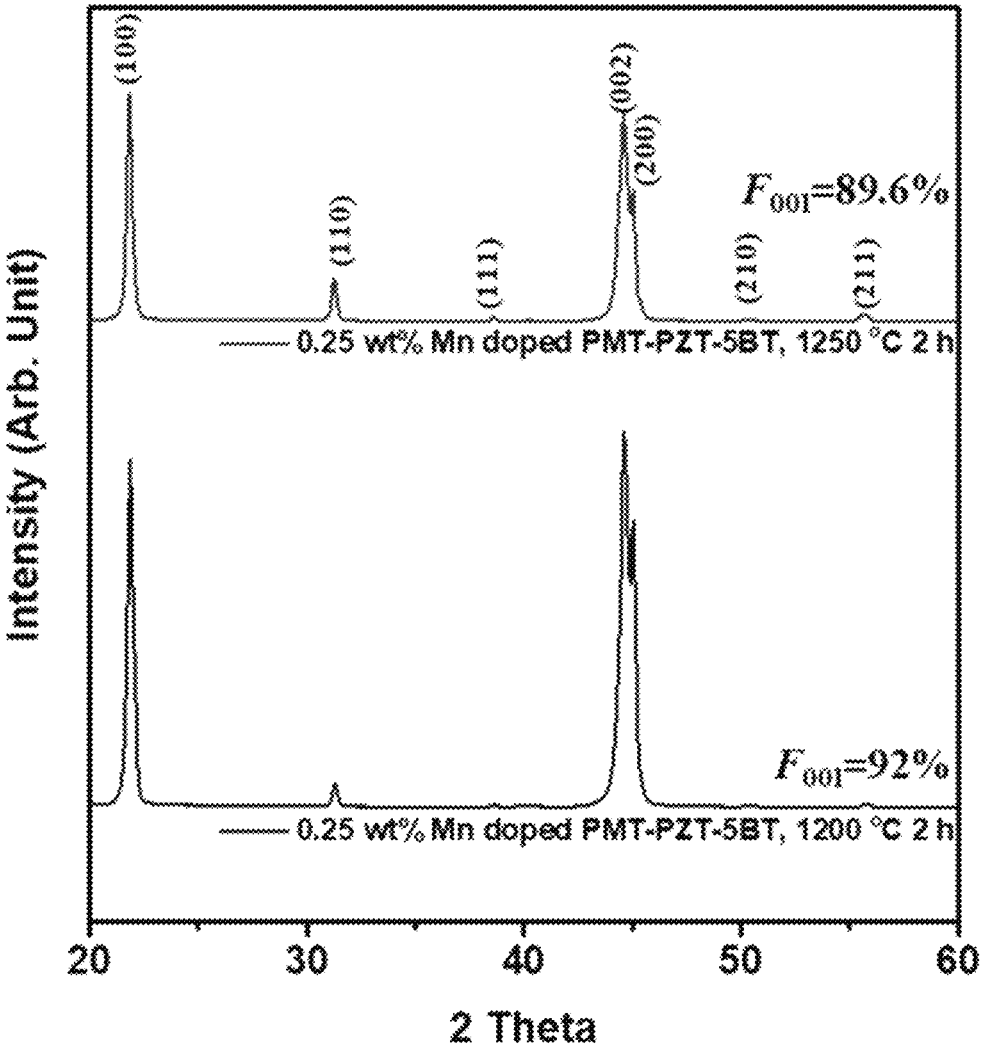

FIG. 40 shows XRD patterns of textured 0.25 wt % Mn doped 0.4Pb(Mg1/3Ta2/3)O3-0.2PbZrO3-0.4PbTiO3 (0.4PMT-0.2PZ-0.4PT) ceramics.

Figure 41:
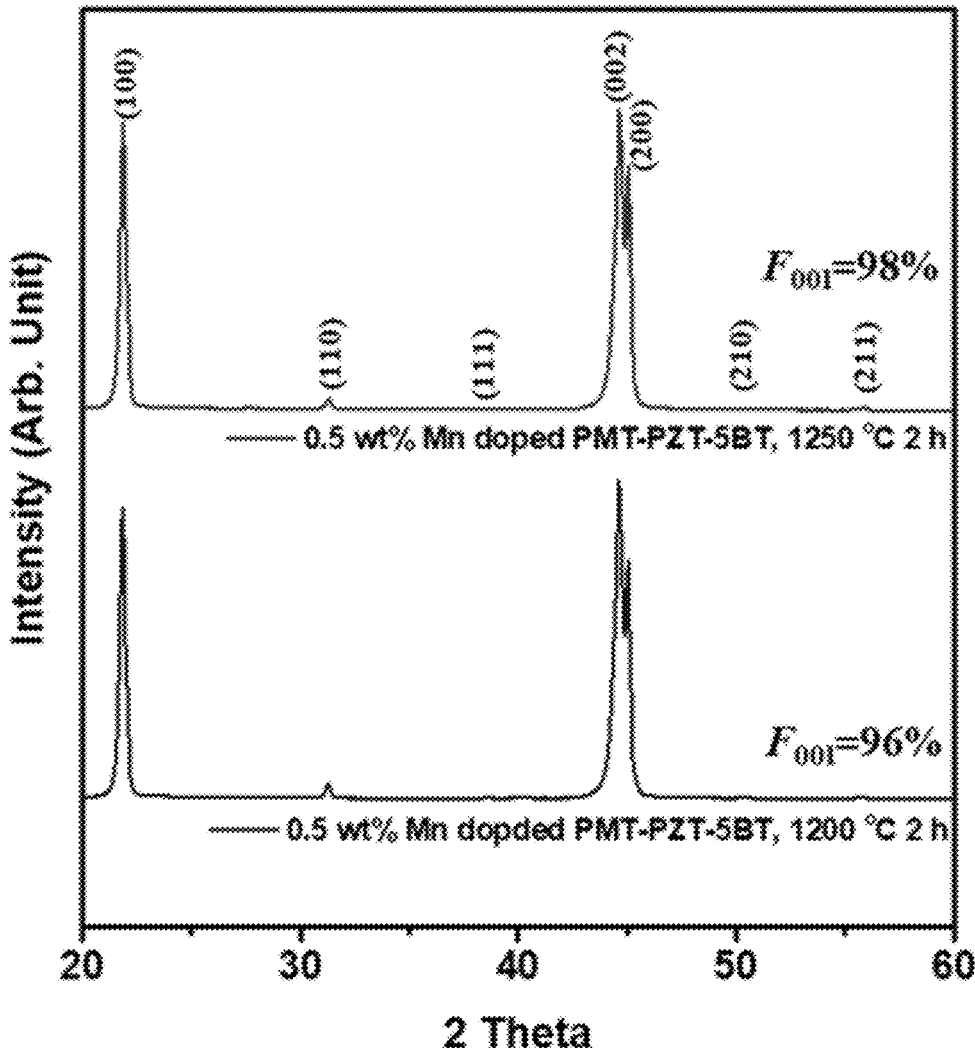

FIG. 41 shows XRD patterns of textured 0.5 wt % Mn doped 0.4Pb(Mg1/3Ta2/3)O3-0.2PbZrO3-0.4PbTiO3 (0.4PMT-0.2PZ-0.4PT) ceramics.

Figure 42:
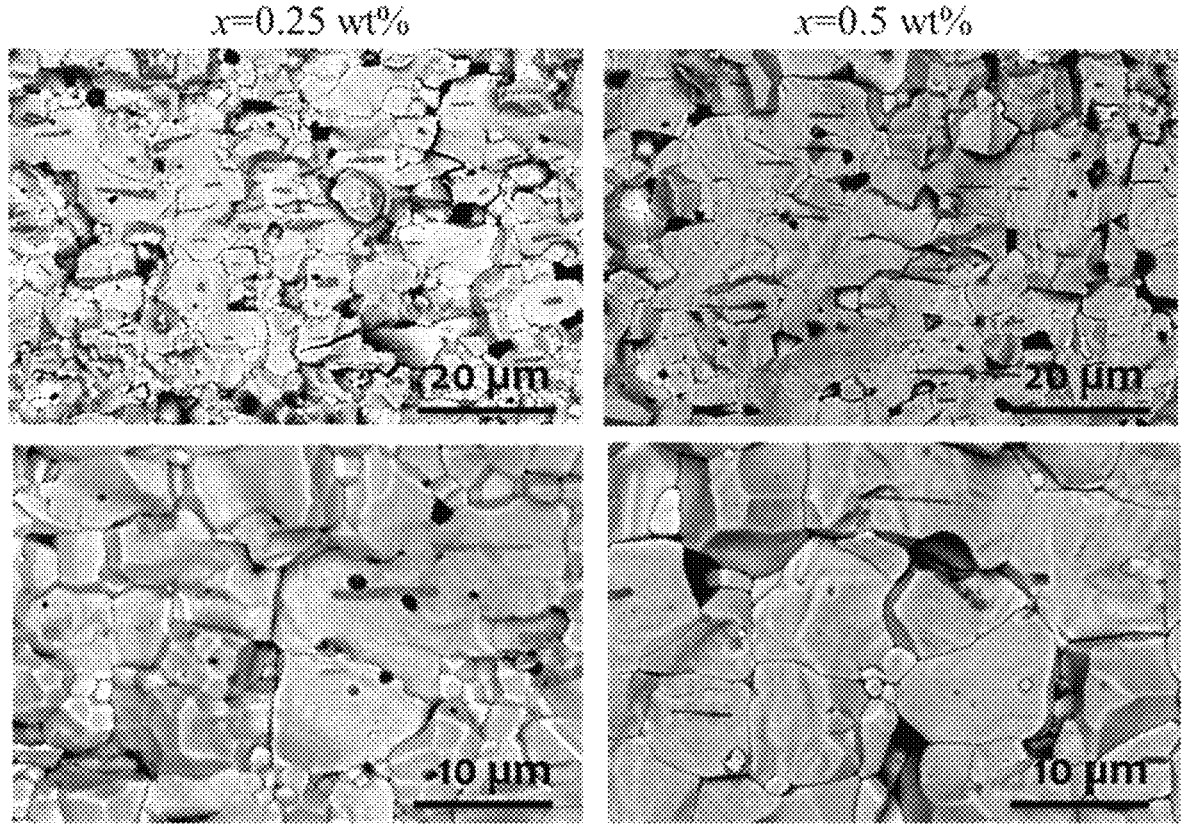

FIG. 42 shows SEM micrographs of textured x wt % Mn doped PMT-PZT ceramics.

DETAILED DESCRIPTION OF THE INVENTION

The following description is of an embodiment presently contemplated for carrying out the present invention. This description is not to be taken in a limiting sense, but is made merely for the purpose of describing the general principles and features of the present invention. The scope of the present invention should be determined with reference to the claims.

Embodiments disclosed herein can include a material that can be configured to have a piezoelectric, a dielectric, and/or an electromechanical property. In some embodiments, the material can be included in a device or other type of apparatus. Some devices can include a plurality of materials. For instance, an exemplary apparatus can be configured as a piezoelectric system or piezoelectric device having at least one embodiment of the material. In some embodiments, the device can be a piezoelectric sensor, a piezoelectric transducer, a piezoelectric generator, a piezoelectric actuator, etc. Some embodiments of the apparatus can be configured for generating a material for piezoelectric devices that may be suitable for high performance electromechanical applications.

Embodiments of the material may include a ceramic. Embodiments of the material may be configured to include a perovskite crystalline structure. A perovskite crystalline structure can include a general chemical formula of $ABX_3$, where $A^{2+}$ and $B^{4+}$ may be cations and $X^{2-}$ may be oxygen. An exemplary perovskite ceramic can be lead titanate (Pb-TiO$_3$), for example. The lattice structure of a perovskite material at room temperature can exhibit phases that are cubic, orthorhombic, tetragonal, monoclinic, rhombohedral, etc. Mixed phases can also exist at the same time and this is advantageous in achieving high soft properties. The oxygen may be located at the face centers of the lattice. The size and/or valence of the A and/or B ions can be changed or controlled to generate distortions and/or introduce instability in the crystalline structure. Some embodiments of the material can include a ferroelectric property. For example, the material can exhibit a polarization that may be modifiable due to an application of an electric filed (E-field).

Some embodiments of the material can include a binary system or a binary mixture of substances. Some embodiments of a material can include a ternary system or a ternary mixture of substances. Some embodiments of the material can be configured as a binary and/or ternary system. Some embodiments of the material may be configured to include a morphotropic phase boundary (MPB). Some embodiments of the material may be configured to include mixed rhombohedral and/or tetragonal ferroelectric phases. Embodiments of a piezoelectric device may include any one and/or combination of the materials and/or systems described herein.

Some embodiments of the material may be configured to include a relaxor-based ferroelectric structure. An example can be a relaxor-lead titanate based ferroelectric structure, which may have a general formula of $Pb(M_I,M_{II})O_3$—$PbTiO_3$. $Pb(M_I,M_{II})O_3$ may be referred to as a relaxor end member. Pb can be referred to as A-site. $(M_I,M_{II})$ and/or Ti can be referred to as B-sites. The $M_I$ may be a low valance cation. The $M_{II}$ may be a high valance cation. The $(M_I,M_{II})$ portion may generate a relaxor component. Relaxor components can include polarized nanoregions (PNRs). PNRs can be formed by causing a nanoscale local region to have a dominant structure with spontaneous polarizations different from a nearby matrix of the material. The spontaneous polarization regions may be with a range from several nanometers to several tens of nanometers. Exemplary materials with PNRs may include lead lanthanum zirconate titanate (PLZT), lead magnesium niobate (PMN), lead zinc niobate (PZN), PMN-lead titanate (PbTiO$_3$) solid solution, lead barium metaniobate (PBN), $Na_{1/2}Bi_{1/2}O_3$ (NBT), etc. Exemplary relaxor-based ferroelectric materials with perovskite structures can include PMN, PMN-PT, etc.

An aspect of the method can include use of chemical modifications and/or texturing. Texturing may be done to generate a piezoelectric ceramic with non-randomly orientated grains. More particularly, texturing may be done to increase the tetragonality degree of the piezoelectric ceramic. The chemical modifications may be done to increase vibration velocity ($v \propto Q_m \cdot d \cdot E_c$) of the ceramic. Any one or combination of the embodiments chemical modifications and texturing can be used to generate a piezoelectric ceramic with high strain coefficient d, high electromechanical coupling coefficient k, high mechanical quality factor ($Q_m$), and/or high coercive field ($E_u$), thereby leading to high vibration velocity ($v \propto Q_m \cdot d \cdot E_c$) and large figure of merit ($Q_m \cdot d_{33} \cdot E_c$). For instance, embodiments of the chemical modified piezoelectric ceramic can exhibit $d_{33}=363$ pC/N, $Q_m=2800$, $E_c=10.1$ KV/cm and $Q_m \cdot d_{33} \cdot E_c$ around 1 CV/Nm. Embodiments of the textured piezoelectric ceramic can exhibit $d_{33}>710$ pC/N, $k_{31}=0.52$, and $Q_m \approx 950$.

Referring to FIG. 1, exemplary processes for making an embodiment of the piezoelectric ceramic are illustrated.

FIG. 1 shows an exemplary process for fabricating a Cu doped piezoelectric ceramic, which involves forming a matrix powder including a composition having a relaxor-lead titanate based ferroelectric structure with a general formula of $Pb(M_I,M_{II})O_3$—$PbTiO_3$. The composition is doped using $MnO_2$ (e.g., using 2 mol. % $MnO_2$). The Mn-doped composition is synthesized by a two-step columbite precursor method: 1) $In_2O_3$ and $Nb_2O_5$ are used to prepare $InNb_2O_4$ precursor; 2) stoichiometric amounts of PbO, $InNb_2O_4$, $MgNb_2O_6$, $TiO_2$, and $MnO_2$ are mixed into the composition. The mixture is allowed to dry. The dried mixtures are calcinated. This process can form a 2 mol. % $MnO_2$ doped $0.24$ $Pb(In_{1/2}Nb_{1/2})O_3$-$0.42Pb(Mg_{1/3}Nb_{2/3})O_3$-$0.34PbTiO_3$ ("PIN-PMN-PT") in powder form. CuO can be added to the Mn-doped PIN-PMN-PT powder. The Cu—Mn-doped PIN-PMN-PT powder can be balled milled and sintered. The sintered Cu—Mn-doped PIN-PMN-PT can then be poled.

FIG. 1 also shows an exemplary process for fabricating a textured piezoelectric ceramic using $BaTiO_3$ (BT) templates via a templated grain growth (TGG) texturing process. The BT-TGG texturing process can be used to texture a Mn-doped PIN-PMN-PT, as well as a Cu—Mn-doped PIN-PMN-PT. The process involves forming a matrix powder including a composition having a relaxor-lead titanate based ferroelectric structure with a general formula of $Pb(M_I,M_{II})O_3$—$PbTiO_3$. The composition is doped using $MnO_2$ (e.g., using 2 mol. % $MnO_2$). The Mn-doped composition is synthesized by a two-step columbite precursor method: 1) $In_2O_3$ and $Nb_2O_5$ are used to prepare $InNb_2O_4$ precursor; 2) stoichiometric amounts of PbO, $InNb_2O_4$, $MgNb_2O_6$, $TiO_2$, and $MnO_2$ are mixed into the composition. The mixture is allowed to dry. The dried mixtures are calcinated. This process can form a 2 mol. % $MnO_2$ doped $0.24$ $Pb(In_{1/2}Nb_{1/2})O_3$-$0.42Pb(Mg_{1/3}Nb_{2/3})O_3$-$0.34PbTiO_3$ ("PIN-PMN-PT") in powder form. The Mn-doped PIN-PMN-PT can then be textured, or CuO can be added to the Mn-doped PIN-PMN-PT powder before being textured. For texturing, $BaTiO_3$ (BT) templates are prepared by a two-step topochemical microcrystal conversion (TMC) method. The Mn-doped PIN-PMN-PT or the Cu—Mn-doped PIN-PMN-PT is then textured by a TGG process using BT templates. BT-TGG textured Mn-doped PIN-PMN-PT or Cu—Mn-doped PIN-PMN-PT can be sintered, and poled.

Chemical Modification/Doping

An embodiment involves adding Cu to a Mn-doped piezoelectric ceramic.

As noted herein, it is desired to have high strain coefficient d, high electromechanical coupling coefficient k, high mechanical quality factor ($Q_m$), and high coercive field ($E_c$) to give a high vibration velocity ($v \propto Q_m \cdot d \cdot E_c$) and large figure of merit $Q_m \cdot d_{33} \cdot E_c$. Embodiments of the piezoelectric ceramic include a $0.24$ $Pb(In_{1/2}Nb_{1/2})O_3$-$0.42Pb(Mg_{1/3}Nb_{2/3})O_3$-$0.34PbTiO_3$ ("PIN-PMN-PT") that is Mn-doped and modified via the addition of Cu. Other example formulations include—$Pb(Yb_{1/2}Nb_{1/2})O_3$—$Pb(Mg_{1/3}Nb_{2/3})O_3$—$PbTiO_3$, $Pb(Sc_{1/2}Nb_{1/2})O_3$—$Pb(Mg_{1/3}Nb_{2/3})O_3$—$PbTiO_3$, $Pb(Zn_{1/3}Nb_{2/3})O_3$—$Pb(Mg_{1/3}Nb_{2/3})O_3$—$PbTiO_3$, $Pb(Fe_{1/2}Nb_{1/2})O_3$—$Pb(Mn_{1/3}Nb_{2/3})O_3$—$PbTiO_3$, etc. For example, the piezoelectric ceramic can be 0.125 wt % CuO and 2 mol % $MnO_2$ doped PIN-PMN-PT. The 0.125 wt % CuO and 2 mol % $MnO_2$ doped PIN-PMN-PT exhibits a figure of merit ($Q_m \cdot d_{33} \cdot E_c$) of at least 1 CV/Nm, which is over 2 times higher than the state-of-art commercial piezoelectric ceramics including PZT4 and PZT8 (0.21 and 0.43 CV/Nm, respectively). The 0.125 wt % CuO and 2 mol % $MnO_2$ doped PIN-PMN-PT also has $d_{33}=363$ pC/N, $Q_m=2800$, $E_c=10.1$ KV/cm.

The Cu—Mn doped PIN-PMN-PT with 0.125 wt % CuO is exemplary. The wt % of CuO can range from 0.0 wt % to 0.5 wt %. Table 1 shows a 0.0 wt % CuO and 2 mol % $MnO_2$ doped PIN-PMN-PT having $d_{33}=370$ pC/N, $Q_m=1693$, $E_c=9.33$ KV/cm, and a $Q_m \cdot d_{33} \cdot E_c=0.584$. A 0.125 wt % CuO and 2 mol % $MnO_2$ doped PIN-PMN-PT has $d_{33}=363$ pC/N, $Q_m=2800$, $E_c=10.1$ KV/cm, and a $Q_m \cdot d_{33} \cdot E_c=1.03$. A 0.25 wt % CuO and 2 mol % $MnO_2$ doped PIN-PMN-PT has $d_{33}=374$ pC/N, $Q_m=2096$, $E_c=9.81$ KV/cm, and a $Q_m \cdot d_{33} \cdot E_c=0.769$. A 0.5 wt % CuO and 2 mol % $MnO_2$ doped PIN-PMN-PT has $d_{33}=372$ pC/N, $Q_m=1921$, $E_c=10.1$ KV/cm, and a $Q_m \cdot d_{33} \cdot E_c=0.726$.

Exemplary Cu—Mn Doped PIN-PMN-PT Ceramic

Exemplary samples of a Cu—Mn doped PIN-PMN-PT were fabricated to ascertain the hard and soft properties of such a piezoelectric ceramic. The fabrication of the samples involved generating a matrix powder, the matrix powder including a composition of 2 mol % $MnO_2$ doped PIN-PMN-PT synthesized by a two-step columbite precursor method. Raw materials of $In_2O_3$ and $Nb_2O_5$ were used to prepare $InNb_2O_4$ precursor at 1100° C. for 7 h. Stoichiometric amounts of PbO, $InNb_2O_4$, $MgNb_2O_6$, $TiO_2$, and $MnO_2$ were mixed in ethanol for 24 h. The dried mixtures were calcined at 850° C. for 4 h. Different samples were produced, each having different amounts of CuO added into the Mn doped PIN-PMN-PT calcined powder. The calcined powders were balled milled in ethanol for 48 h to decrease the particle sizes. The balled milled powders were pressed into pellets with 12 mm in diameter. The pellets were embedded in calcined Mn-doped PIN-PMN-PT powders containing 1.5 wt % excess PbO within a closed crucible and sintered at 1150-1220° C. for 6 h in air.

The crystal phases of the sintered pellets were determined using X-ray diffraction (XRD). Microstructures were evaluated using scanning electron microscopy (SEM). For electrical measurements, the sample surfaces were polished and coated with silver paste. All the samples were poled at 40 kV/cm for 30 min at 140° C. After aging for 48 h, the piezoelectric coefficient $d_{33}$ was measured by using a $d_{33}$ meter. Polarization vs. electric field (P-E) hysteresis loop was measured using a modified Sawyer-Tower circuit.

The mechanical coupling coefficient (k) and mechanical quality factor ($Q_m$) were measured by resonance and anti-resonance technique using impedance analyzer.

FIG. 2 shows the XRD patterns for Mn-doped PIN-PMN-PT ceramics with different CuO contents. All samples exhibited pure perovskite structure without any noticeable secondary phase.

FIG. 3 shows the SEM images of the fracture surface of Mn-doped PIN-PMN-PT ceramics with different CuO contents. All the samples exhibited dense microstructure with no obvious pores, indicating that the CuO dopant promotes the densification of Mn-doped PIN-PMN-PT ceramics.

Table 1 lists the dielectric and piezoelectric properties for Mn doped PIN-PMN-PT ceramics with different CuO contents. Particularly, the Mn doped PIN-PMN-PT sample with 0.125 wt % CuO exhibited a giant figure of merit of $Q_m \cdot d_{33} \cdot E_c$ around 1 CV/Nm, which is significantly higher than most commercial piezoelectric ceramics including PZT4 and PZT8 (0.21 and 0.43 CV/Nm, respectively).

$k_{31}$=0.52, and which are superior than most reported and commercial piezoelectric ceramics.

Relaxor-based PIN-PMN-PT ternary ferroelectrics have been widely investigated due to their superior piezoelectric properties including high phase transition temperatures ($T_{r-t}$ and $T_c$) and high coercive field ($E_c$) in comparison with $Pb(Mg_{1/3}Nb_{2/3})O_3$—$PbTiO_3$ (PMN-PT) binary ferroelectrics. Mn-doping can be used to generate the hard properties of piezoelectric ceramics, where $Mn^{3+}$ will substitute B-site in perovskite structure of piezoelectric materials creating oxygen vacancies and the oxygen vacancies will diffuse to the domain boundary region and pin the domain wall motion resulting in hard effect (high $Q_m$ and low tan δ).

Embodiments disclosed herein involve texturing 2 mol. % $MnO_2$ doped PIN-PMN-PT ceramics using a BT-TGG method. The effects of template content on <001> texturing degree, microstructures, and dielectric and piezoelectric properties of textured Mn-doped PIN-PMN-PT ceramics were investigated. In addition, the CuO dopant was added to

TABLE 1

Dielectric and piezoelectric properties for Mn doped
PIN-PMN-PT ceramics with different CuO contents.

| Specimen | $E_c$ (KV/cm) | $\varepsilon_{33}^{T}/\varepsilon_o$ | tan δ (%) | $d_{33}$ (pC/N) | $k_T$ | $k_P$ | $Q_m$ | $d_{33} \times E_c \times Q_m$ (CV/Nm) |
|---|---|---|---|---|---|---|---|---|
| 2 mol. % Mn doped PIN-PMN-PT | 9.33 | 1447 | 0.47 | 370 | 0.57 | 0.56 | 1693 | 0.584 |
| 0.125 wt % CuO-2 mol. % Mn doped PIN-PMN-PT | 10.1 | 1452 | 0.54 | 363 | 0.57 | 0.54 | 2800 | 1.03 |
| 0.25 wt % CuO-2 mol. % Mn doped PIN-PMN-PT | 9.81 | 1460 | 0.57 | 374 | 0.57 | 0.53 | 2096 | 0.769 |
| 0.5 wt % CuO-2 mol. % Mn doped PIN-PMN-PT | 10.1 | 1409 | 0.97 | 372 | 0.57 | 0.54 | 1921 | 0.726 |

In summary, CuO dopant can enhance both sintering ability and piezoelectric properties of Mn doped PIN-PMN-PT ceramics. Particularly, the Mn doped PIN-PMN-PT sample with 0.125 wt % CuO exhibited good piezoelectric properties of $d_{33}$=363 pC/N, $Q_m$=2800, Ec=10.1 KV/cm, along with giant figure of merit of $Q_m \cdot d_{33} \cdot E_c$ around 1 CV/Nm, which is much superior than most commercial piezoelectric ceramics.

Texturing

Texturing is a process that provides grain orientation along specific crystallographic direction of a piezoelectric ceramic. This can be done to align some or all of the grains. Texturing is a known means to develop high performance piezoelectric ceramics from non-single crystal ceramics as an alternative to single crystal piezoelectric ceramics—e.g., single crystal piezoelectric ceramics tend to be expensive, and thus texturing of non-single crystal ceramics can be a suitable alternative. Embodiments of the texturing method disclosed herein involve a templated grain growth (TGG) method that uses a $BaTiO_3$ ("BT") template. The texturing method can be referred to as a BT-TGG.

In a randomly oriented ceramic, both high $Q_m$ and high $d_{33}$ are not achievable because any increase in $Q_m$ and $E_c$ via domain pinning will result in the degradation of $d_{33}$ and k. Yet, embodiments of the PIN-PMN-PT can be textured via the BT-TGG method to increase the piezoelectric response of the ceramic—i.e., BT-TGG texturing can improve both the strain coefficient, d, and electromechanical coupling coefficient, k. As will be explained herein, the BT-TGG method increases the texturing degree of the PIN-PMN-PT, leading to the BT-TGG textured PIN-PMN-PT exhibiting ultrahigh piezoelectric properties with $d_{33}$>710 pC/N, promote the texturing development of Mn doped PIN-PMN-PT ceramics. It was found that the textured ceramics can exhibit excellent soft and hard combinatory properties in comparison with random counterparts, demonstrating that the texturing is an effective method to improve the piezoelectric response of piezoelectric ceramics.

Exemplary BT-TGG Textured PIN-PMN-PT Ceramic

Exemplary samples of BT-TGG textured PIN-PMN-PT were fabricated to ascertain the hard and soft properties of such piezoelectric ceramic.

The first set of samples were Mn-doped PIN-PMN-PT ceramics textured via BT-TGG. The BT-TGG textured Mn-doped PIN-PMN-PT exhibited enhanced piezoelectric coefficient $d_{33}$ and electromechanical coupling factor $k_{31}$ in comparison with a random counterpart. The effects of BT template content on piezoelectric properties of the PIN-PMN-PT ceramic was investigated. It was found that the addition of $BaTiO_3$ templates can increase the tetragonality degree of the textured ceramics, resulting in improved coercive field $E_c$ in comparison with random counterpart. In addition, the high BT content (>3 vol. %) can slightly lower the $d_{33}$ of the textured PIN-PMN-PT ceramic, indicating that the enhancement of piezoelectric coefficient brought by high texturing degree (around 95%) will be reduced by the phase structure evolution to a tetragonal phase region. Two textured ceramics (one with 2 vol. % and one with 3 vol. % BT template—referred to as Textured-2BT and Textured 3BT) are shown to exhibit a high $d_{33}$ (>510 pC/N) and high $Q_m$ (>1000).

The second set of samples were CuO modified Mn-doped PIN-PMN-PT ceramics textured via BT-TGG. The CuO dopant was found to promote the texturing development of the Mn doped PIN-PMN-PT. Particularly, CuO-doped textured-1BT ceramic (1BT meaning 1 vol. % BT template) can exhibit high texturing degree over 94% with ultrahigh piezoelectric properties of $d_{33}$>710 pC/N, $k_{31}$=0.52, and $Q_m$≈950, which is superior than most reported and commercial piezoelectric ceramics. For instance, a BT-TGG 0.25 wt % CuO and 2 mol % $MnO_2$ doped PIN-PMN-PT exhibits a high $Q_m$·d. (e.g., texture degree over 94%), and ultrahigh piezoelectric properties of $d_{33}$>710 pC/N, $k_{31}$=0.52, and $Q_m$≈950.

The fabrication of the samples involved generating a matrix powder, the matrix powder including a composition of 2 mol. % $MnO_2$ doped PIN-PMN-PT synthesized by a two-step columbite precursor method. Raw materials of $In_2O_3$ and $Nb_2O_5$ were used to prepare $InNb_2O_4$ precursor at 1100° C. for 7 h. Stoichiometric amounts of PbO, $InNb_2O_4$, $MgNb_2O_6$, $TiO_2$, and $MnO_2$ were mixed in ethanol for 24 h. The dried mixtures were calcined at 850° C. for 4 h. The calcined powders were balled milled in ethanol for 72 h to decrease the particle size.

$BaTiO_3$ (BT) templates were prepared by two-step topochemical microcrystal conversion (TMC) method. The 2 mol. % Mn-doped PIN-PMN-PT ceramics were textured by the templated grain growth (TGG) using x vol. % BT templates (x=1, 2, 3, 5). The samples are abbreviated as textured-xBT hereafter. The matrix powders, templates, organic binder, and toluene solvent were mixed to prepare the slurries for tape casting. The dried tapes were cut, stacked, and laminated to fabricate green samples. After binder burnout at 550° C. and cold-isostatic pressing at 200 MPa, the samples were then embedded in calcined Mn-doped PIN-PMN-PT powders containing 1.5 wt % excess PbO within a closed crucible and sintered at 1220° C. for 6 h in air.

The crystal phases of the textured samples were determined using X-ray diffraction. The degree of pseudocubic <001> texture was determined by Logtering factor method. Microstructures were evaluated using SEM in combination with energy dispersive spectroscopy (EDS) and electron backscatter diffraction (EBSD). For electrical measurements, the sample surfaces were polished and coated with silver paste. All the samples were poled at 40 kV/cm for 30 min at 140° C. After aging for 48 h, the piezoelectric coefficient $d_{33}$ was measured by using a $d_{33}$ meter. Temperature-dependent dielectric permittivity ($\varepsilon_r$) and loss tangent (tan δ) were measured with a multifrequency LCR meter. Temperature-dependent dielectric permittivity ($\varepsilon_r$) and loss tangent (tan δ) were used to further elucidate the phase structure. Polarization vs. electric field (P-E) hysteresis loop was measured using a modified Sawyer-Tower circuit. The mechanical coupling coefficient (k) and mechanical quality factor ($Q_m$) were measured by resonance and anti-resonance technique using impedance analyzer.

FIGS. 4-6 show the morphology and XRD pattern of BT templates synthesized by the TMC method. It can be seen that the BT template had large anisotropy with about 10 μm in length and 1 μm in thickness, and exhibited tetragonal perovskite structure. Thus, the BT templates can be easily aligned under the shear force through doctor blade during tape casting process.

FIG. 7 shows the XRD patterns for both random and textured Mn-doped PIN-PMN-PT ceramics with different BT template contents. All samples exhibited pure perovskite structure without any noticeable secondary phase. With the introduction of the BT template, the intensities of (00l) peaks increased rapidly while other peaks decreased significantly, indicating the formation of texture.

FIG. 8 shows the texturing degree as a function of BT template content. By increasing the BT content from 1 vol. % to 3 vol. %, the $F_{(00l)}$ increases dramatically from 80% to 91.4%, indicating that the 3 vol. % is enough to achieve a high texture quality for Mn-doped PIN-PMN-PT. The texturing degree further increases to 95% by increasing the BT content to 5 vol. %.

The EBSD inverse pole figure maps (see FIG. 9) evidenced the high <001> orientation of grains in textured ceramic, while most of the grains are randomly oriented in random counterpart, which is consistent with the XRD patterns (FIG. 7).

FIG. 10 shows the microstructure evolution of textured Mn-doped PIN-PMN-PT with different BT contents. Both 3 vol. % and 5 vol. % textured samples show brick wall-like microstructures with well aligned BT templates (black areas) inside the oriented matrix grains, representing the development of texture, in comparison with the random ceramic with equiaxed grains.

EDS mapping of textured ceramic are shown in FIG. 11, indicating that the BT template is stable inside the matrix grains, and no obvious interfacial reaction and diffusion happen at the interface between the matrix and BT template.

FIGS. 12 and 13 show the dielectric constant $\varepsilon_r$ and loss tan δ as a function of temperature for both random and textured Mn-doped PIN-PMN-PT samples. As the template content decreases, the Curie temperature $T_c$ increases. The textured ceramics can exhibit a high $T_c$ above 200° C., which is almost 30-70° C. higher than the binary PMN-PT ceramics, indicating the wider temperature use range for textured Mn-doped PIN-PMN-PT ceramics in high power applications. FIG. 14 shows the P-E hysteresis loops for textured and random ceramics. All the samples exhibited well-saturated hysteresis loops at the electric field of 40 KV/cm. FIG. 15 compares the unipolar strain-electric (S E) curves for both textured and random ceramics. When the electric field is applied to the ceramic samples, the domain rotation will happen generating the strain response. The textured ceramics can exhibit almost ~2 times improvement in maximum strain $S_m$ at the same electric field in comparison with random counterparts, indicating that the domain rotation happens easier in textured ceramics.

FIG. 16 shows the piezoelectric constant $d_{33}$, mechanical quality factor $Q_m$, and coercive field $E_c$ as the function of BT template contents. When x≤3%, $d_{33}$ increases rapidly with increasing x. The optimized value of 529 pC/N was obtained at x=3%, which is attributed to the improved texturing degree. However, with further increasing BT content to 5%, the $d_{33}$ decreases to 475 pC/N. The reduced piezoelectric response may be mainly attributed to the phase structure evolution. The magnification of XRD patterns in the range from 42° to 47° is shown in FIG. 17, and the {002} peaks start to split with increasing the BT content, indicating the increased tetragonality in textured ceramics.

FIG. 18 shows polarization rotation between rhombohedral and tetragonal crystal structure. Tetragonal structure has 90° spontaneous polarization directions in comparison with rhombohedral structure where the polarization direction is 71° as shown in FIG. 18, indicating that the polarization rotation in tetragonal structure is more difficult to happen after applying the same external electrical field E, leading to lower piezoelectric response. Therefore, the reduced piezoelectric constant of textured sample with 5 vol. % BT templates is caused by the high tetragonality of the sample. The crystal structure of the textured sample gradually transforms into tetragonal structure with increasing x because the BT template has a tetragonal structure. For a PIN-PMN-PT ternary system, the coercive field value of the tetragonal structure is higher than that of the rhombohedral structure, indicating that the domain rotation is difficult in tetragonal structure, which is consistent with experimental results where the coercive field value $E_c$ continuously increases with increasing x. However, the mechanical quality factor $Q_m$ decreased as the BT content increased. The random sample exhibited the highest $Q_m$ value of 1693.

Table 2 shows the dielectric and piezoelectric properties for both random, textured, and reported (conventional) piezoelectric ceramics. In the Table, x BT refers to x vol. % BT templates (e.g., 0BT=vol. 0% BT, 1BT=vol. 1% BT, 2BT=vol. 2% BT, 3BT=vol. 3% BT, and 5BT=vol. 5% BT). Mn doped textured PMN-PT ceramic exhibits good piezoelectric properties with low $T_c$ ($d_{33}$=517 pC/N, $Q_m$=714, $T_c$=130° C.). In comparison, the BT textured Mn doped PIN-PMN-PT ceramics (e.g., 1-BT, 2-BT, 3-BT, and 4-BT) showed improved piezoelectric properties with high $T_c$. Particularly, textured-2BT sample exhibited an excellent combined soft and hard piezoelectric properties of $d_{33}$=517 pC/N, $Q_m$=1148, along with high $T_c$ around 205° C.

Exemplary CuO Doped BT-TGG Textured PIN-PMN-PT Ceramic

Exemplary samples of CuO doped BT-TGG textured PIN-PMN-PT were fabricated to ascertain the hard and soft properties of such piezoelectric ceramic. Samples of a 2 mol. % Mn-doped PIN-PMN-PT ceramic doped with 0.125 and 0.25 wt. % CuO were textured by the BT-TGG texturing method using x vol. % BT templates (x=0.5, 1, 2). The samples are abbreviated as textured-xBT hereafter. Matrix powders, templates, organic binder, and toluene solvent were mixed to prepare the slurries for tape casting. The dried tapes were cut, stacked, and laminated to fabricate green samples. After binder burnout at 550° C. and cold-isostatic pressing at 200 MPa, the samples were then embedded in calcined Mn-doped PIN-PMN-PT powders containing 1.5 wt % excess PbO within a closed crucible and sintered at 1200-1220° C. for 6 h in air.

FIG. 19 shows the XRD patterns for textured Mn-doped PIN-PMN-PT ceramics with different CuO contents. CuO-doped ceramics with 1 and 2 vol. % BT templates are 94% and 97% textured, respectively, while the undoped ceramic with 2 vol. % BT templates is only 84% textured, suggesting

TABLE 2

Dielectric and piezoelectric properties for both random and textured piezoelectric ceramics, compared to reported (conventional) textured Mn doped PMN-PT ceramic CuO-doping effect on BT-TGG Method

| Specimen | $F_{001}$ (%) | $T_c$ (° C.) | $E_c$ (KV/cm) | $\varepsilon_{33}^T/\varepsilon_o$ | tan δ (%) | $d_{33}$ (pC/N) | $d_{31}$ (pC/N) | $k_{31}$ | $Q_m$ |
|---|---|---|---|---|---|---|---|---|---|
| 2 mol. % Mn doped PIN-PMN-PT-0BT | 0 | 213 | 9.37 | 1351 | 0.58 | 370 | 122 | 0.34 | 1693 |
| 2 mol. % Mn doped PIN-PMN-PT-1BT | 80 | 207 | 10.01 | 1422 | 0.47 | 457 | 155 | 0.40 | 1249 |
| 2 mol. % Mn doped PIN-PMN-PT-2BT | 84 | 205 | 10.04 | 1514 | 0.49 | 517 | 169 | 0.42 | 1148 |
| 2 mol. % Mn doped PIN-PMN-PT-3BT | 91.4 | 205 | 10.01 | 1520 | 0.49 | 529 | 175 | 0.42 | 1023 |
| 2 mol. % Mn doped PMN-25P-7 vol. % NBT-0.6PT[19] | 49 | 130 | — | — | 0.5 | 517 | — | 0.44 | 714 |
| 2 mol. % Mn doped PZT-PMN-PZN-5BT | 95 | 199 | 11.4 | 1432 | 0.52 | 475 | 157 | 0.40 | 770 |

A high texturing degree is usually required to achieve single crystal-like piezoelectric response for textured ceramics. Based on the results of a BT-TGG textured Mn-doped PIN-PMN-PT samples, texturing degree over 90% can be achieved using high content of BT template (>3 vol. %). However, the addition of high content of BT template can shift the phase structure of piezoelectric ceramic to tetragonal side due to the high tetragonality of BT template. It is known that the piezoelectric response of PIN-PMN-PT is phase-sensitive, and the highest piezoelectric response can be obtained at the composition close to MPB region similar to PZT. Thus, both texturing degree and phase structure should be considered in order to achieve a giant piezoelectric response of textured ceramic. The textured ceramic with high texturing degree and less heterogenous BT template can be used to meet such requirements. CuO dopant can promote the densification of piezoelectric ceramic at reduced temperature. In addition, the Cu-ion can substitute the A/B sites of the perovskite structure to enhance the piezoelectric properties of the ceramic. Thus, integrating CuO-doping, chemical modification (Mn-doping), and BT-TGG texturing can be used to develop a high-power textured PIN-PMN-PT ceramic with ultrahigh piezoelectric response.

that the CuO dopant acts as an effective texturing aid to promote the texturing development of piezoelectric ceramic.

FIG. 20 shows the electron backscatter diffraction (EBSD) mapping images, which further confirm the high <001> orientated grains in textured ceramic compared to random counterpart.

FIG. 21 shows the high-magnification EDS element mapping of an interface between BT template and textured grain. The interface between the <001> BT template and matrix grain is quite sharp, indicating that the BT template is stable inside the matrix grain.

FIG. 22 shows the impedance and phase angle spectra for textured Mn doped PIN-PMN-PT-2BT with 0.25 wt % CuO (T-2BT) ceramic. Electromechanical properties such as $Q_m$ are obtained from the electrical impedance method based on IEEE standard.

FIG. 23 shows the piezoelectric figure of merit $d_{33} \times g_{33}$ and electromechanical coupling factor $k_{31}$ for random, textured ceramics and single crystal counterpart. The textured ceramic exhibits a large $d_{33} \times g_{33}$ value of $39.7 \times 10^{-12}$ m$^2$ N$^{-1}$, due to high $g_{33}$ value of $54.7 \times 10^{-3}$ V m N$^{-1}$, which is the result of the significantly improved $d_{33}$ and suppressed dielectric permittivity. Besides, in contrast to both random and sing crystal counterparts, the textured ceramic can possess higher $k_{31}$ value of 0.54.

FIG. 24 shows the microstructures of textured Mn doped PIN-PMN-PT-2BT with 0.25 wt % CuO (T-2BT) ceramic.

Transmission electron microscopy (TEM) imaging of ferro-electric domain structure within the textured grain is shown in FIG. 24a. A large fraction of stripe-type nanodomains can be observed and they are parallel to each other. The nanodomain with size of 15-20 nm can be observed (see the inset of FIG. 24a). Compared to the large domains, the small domains with reduced domain wall energy are more flexible and easily switched under external electric field, leading to the improved extrinsic piezoelectric contributions. Thus, the existence of very small domains (nanodomains) inside the textured grain may make a contribution to the high piezo-electricity of textured ceramics. An atomic-resolution STEM image of the interface between the BT template and PIN-PMN-PT grain in T-2BT sample is shown in FIG. 24b. A defect-free coherent interface can be observed, proving the excellent lattice match between the BT template and matrix grain. The defect-free interface is important for achieving enhanced piezoelectric response since the defects at the interface can act as the pinning center to restrict the movedemonstrating that our textured ceramics are good candidates for high-power piezoelectric device applications.

FIGS. 27 and 28 show the dielectric constant $\varepsilon_r$ and loss tan $\delta$ as a function of temperature for CuO-doped textured samples. The textured ceramics can still exhibit a high $T_c$ above 200° C., indicating a wide temperature use range for textured ceramics in high power applications. FIG. 29 shows the P-E hysteresis loops for CuO-doped textured ceramics. FIG. 30 compares the unipolar strain-electric (S-E) curves for both CuO-doped textured and random ceramics. The textured ceramics can exhibit 2 times improvement in maximum strain $S_m$ at the same electric field in comparison with random counterparts.

Table 3 lists the dielectric and piezoelectric properties of CuO-doped textured ceramics. Particularly, the CuO-doped textured-1BT ceramic exhibited excellent combinatory soft and hard piezoelectric properties of $d_{33}$=713 pC/N, $k_{31}$=0.52, $Q_m$=949, and $E_c$=9.64 KV/cm.

TABLE 3

Dielectric and piezoelectric properties for textured piezoelectric ceramics with different CuO contents, compared to reported (conventional) textured Mn doped PMN-PZT and PMN-PT ceramics

| Specimen | $F_{001}$ (%) | $T_c$ (° C.) | $E_c$ (KV/cm) | $\varepsilon_{33}^T/\varepsilon_o$ | tan $\delta$ (%) | $d_{33}$ (pC/N) | $d_{31}$ (pC/N) | $k_{31}$ | $Q_m$ |
|---|---|---|---|---|---|---|---|---|---|
| 0.25 wt % CuO-2 mol. % Mn doped PIN-PMN-PT-2BT + 1200° C. 6 h | 97 | 205 | 9.7 | 1498 | 0.42 | 725 | 247 | 0.54 | 716 |
| 0.25 wt % CuO-2 mol. % Mn doped PIN-PMN-PT-2BT + 1220° C. 6 h | >90 | — | 10.5 | 1437 | 0.49 | 652 | 222 | 0.51 | 815 |
| 0.25 wt % CuO-2 mol. % Mn doped PIN-PMN-PT-1BT + 1200° C. 6 h | 94.2 | 205 | 9.64 | 1588 | 0.45 | 713 | 240 | 0.52 | 949 |
| 0.25 wt % CuO-2 mol. % Mn doped PIN-PMN-PT-0.5BT + 1200° C. 6 h | 64 | — | 9.94 | 1483 | 0.45 | 465 | 157 | 0.40 | 1542 |
| 0.125 wt % CuO-2 mol. % Mn doped PIN-PMN-PT-1BT + 1200° C. 6 h | >90 | — | 9.32 | 1603 | 0.41 | 674 | 234 | 0.51 | 906 |
| 1 mol. % Mn doped PMN-PZT-5BT[4] | >90 | 198 | — | 1723 | 0.29 | 680 | 230 | 0.52 | 428 |
| 2 mol. % Mn doped PMN-25PT-7NBT-PT[19] | 49 | 130 | — | — | 0.5 | 517 | — | 0.44 | 714 | ment of ferroelectric domain walls. The FFT patterns extracted from the textured grain and BT template clearly show $<001>_c$ orientation of both textured grain and BT template. The magnified images of the atomic columns inside the textured grains are shown in FIG. 24c. The red and blue circles denote the A-site and B-site cations, respectively. The polar vectors for one unit-cell column can be represented as the atomic displacements from the center of the B-site cation to the center of the nearest neighboring A-site cations. As shown in FIG. 24c, given that the textured sample has a rhombohedral phase structure, the polar vector along the rhombohedral <111> direction can be observed. Besides, the tetragonal-region with polar vector along <001> direction can be found as well, indicating the coex-istence of phases and confirming the vicinity to MPB. Nanoscale structural heterogeneity observed inside the tex-tured matrix grain assists in increasing the interfacial energy and minimizing the polarization discontinuity, which leads to flattened free-energy curve and enhancement of piezo-electricity.

FIG. 26 shows comparison of maximum vibration velocities for commercial hard PZT 4, commercial hard APC 841, textured Mn doped PIN-PMN-PT-1BT with 0.25 wt % CuO (T-1BT), and textured Mn doped PIN-PMN-PT-0.5BT with 0.25 wt % CuO (T-0.5BT) ceramics. The textured ceramic exhibits a vibration velocity of ~1 m/s, which is much higher than that of the commercial hard ceramics, In addition, both CuO-doped textured-1BT and 2BT ceramics exhibited much better combined soft and hard piezoelectric properties ($d_{33}$, $k_{31}$, and $Q_m$) in comparison with the reported (conventional) textured lead-free and lead-based piezoelectric ceramics, which is shown in FIG. 31. Notably, as shown in FIG. 32, the developed textured ceramics can exhibit both high $Q_m$ and high $d_{33}$ in comparison with commercial piezoelectric materials exhibiting either high $Q_m$ or high $d_{33}$ value, but not both at the same time. Finally, from FIG. 33, it can be seen that this newly designed high power textured ceramic exhibits the best high-power properties ($d_{33}$, $Q_m$ and $E_c$) in comparison with other reported textured ceramics and even single crystal counterpart.

The test results indicate that high power piezoelectric ceramics can be successfully fabricated using integrated texturing and chemical modification (Mn-doping) methods. In addition, the effect of template content on piezoelectric properties of textured ceramics was investigated. The results show that the BT template content in textured ceramic should not exceed 3 vol. % to achieve an optimized com-bined soft and hard piezoelectric properties since the high template content (>3 vol. %) can increase the tetragonality degree of textured ceramic, resulting in decreased piezo-electric coefficient. Particularly, the textured Mn-doped PIN-PMN-PT with 2 vol. % BT template exhibited excellent piezoelectric properties of $d_{33}$=517 pC/N, $Q_m$=1148, $E_c$=10 KV/cm.

In addition, the CuO dopant was found to promote the texturing development of Mn doped PIN-PMN-PT. Both CuO-doped textured-1BT and 2BT ceramics can exhibit high texturing degree over 94% in comparison with undoped textured-2BT counterpart with 84% texturing degree, indicating that the CuO dopant is an effective additive to enhance the texturing development of Mn-doped PIN-PMN-PT ceramics. Under the assistance of CuO dopant, the BT template content can be reduced to lower the tetragonality of textured ceramic without deteriorating its high texturing degree. Finally, ultrahigh piezoelectric properties with $d_{33} > 710$ pC/N, $k_{31} = 0.52$, and were achieved in textured ceramics using integrated CuO-doping, chemical modification (Mn-doping), and texturing method. The developed textured ceramics possess much superior combined soft and hard piezoelectric properties in comparison with both reported and commercial piezoelectric ceramics.

Additional Examples

FIG. 34 shows unipolar S-E curves for random and textured 0.25 wt % CuO-2 mol. % Mn doped 0.16PIN-0.51PMN-0.33PT-5BT (MC-doped 0.16PIN-0.51PMN-0.33PT-5BT) ceramics.

Table 4 shows dielectric and piezoelectric properties for both random and textured MC-doped 0.16PIN-0.51PMN-0.33PT piezoelectric ceramics.

TABLE 4

Dielectric and piezoelectric properties for both random and textured
MC-doped 0.16PIN-0.51PMN-0.33PT piezoelectric ceramics

| Specimen | $\varepsilon_{33}{}^{T}/\varepsilon_o$ | $d_{33}$ (pC/N) | $Q_m$ | $E_c$ (KV/cm) |
|---|---|---|---|---|
| MC doped 0.16PIN-0.51PMN-0.33PT-5BT | 1530 | 628 | 610 | 9.0 |
| Random | 1449 | 378 | 1069 | 8.50 |

FIG. 35 shows unipolar S-E curves for random and textured 0.25 wt % CuO-2 mol. % Mn doped 0.28PIN-0.40PMN-0.32PT-5BT (MC-doped 0.28PIN-0.40PMN-0.32PT-5BT) ceramics.

Table 5 shows dielectric and piezoelectric properties for both random and textured MC-doped 0.28PIN-0.40PMN-0.32PT piezoelectric ceramics.

TABLE 5

Dielectric and piezoelectric properties for both random and textured
MC-doped 0.28PIN-0.40PMN-0.32PT piezoelectric ceramics

| Specimen | $\varepsilon_{33}{}^{T}/\varepsilon_o$ | $d_{33}$ (pC/N) | $Q_m$ | $E_c$ (KV/cm) |
|---|---|---|---|---|
| MC doped 0.28PIN-0.40PMN-0.32PT-5BT | 2070 | 467 | 1251 | 10.6 |
| Random | 842 | 250 | 1760 | 9.0 |

FIG. 36 shows unipolar S-E curves for random and textured 0.25 wt % CuO-2 mol. % Mn doped 0.36PIN-0.30PMN-0.34PT-5BT (MC-doped 0.36PIN-0.30PMN-0.34PT-5BT) ceramics.

Table 6 shows dielectric and piezoelectric properties for both random and textured MC-doped 0.36PIN-0.30PMN-0.34PT piezoelectric ceramics.

TABLE 6

Dielectric and piezoelectric properties for both random and textured
MC-doped 0.36PIN-0.30PMN-0.34PT piezoelectric ceramics

| Specimen | $\varepsilon_{33}{}^{T}/\varepsilon_o$ | $d_{33}$ (pC/N) | $Q_m$ | $E_c$ (KV/cm) |
|---|---|---|---|---|
| MC doped 0.36PIN-0.30PMN-0.34PT-5BT | 1550 | 441 | 821 | 12.4 |
| Random | 1449 | 360 | 904 | 10.7 |

FIG. 37 shows XRD patterns of random and textured 1 mol. % Mn doped 0.25PbZrO3-0.35PbTiO3-0.36Pb(Mg1/3Nb2/3)O3-0.04Pb(Zn1/3Nb2/3)O3 (0.6PZT-0.36PMN-0.04PZN) ceramics.

FIG. 38 shows XRD patterns of textured 1 mol. % Mn doped 0.6Pb(Zr0.445Ti0.555)O3-0.4Pb(Zn1/6Ni1/6Nb2/3)O3 (0.6PZT-0.4PZNN) ceramics.

FIG. 39 shows SEM micrographs of textured 1 mol. % Mn doped 0.6PZT-0.4PZNN-xBT ceramics.

FIG. 40 shows XRD patterns of textured 0.25 wt % Mn doped 0.4Pb(Mg1/3Ta2/3)O3-0.2PbZrO3-0.4PbTiO3 (0.4PMT-0.2PZ-0.4PT) ceramics.

FIG. 41 shows XRD patterns of textured 0.5 wt % Mn doped 0.4Pb(Mg1/3Ta2/3)O3-0.2PbZrO3-0.4PbTiO3 (0.4PMT-0.2PZ-0.4PT) ceramics.

FIG. 42 shows SEM micrographs of textured x wt % Mn doped PMT-PZT ceramics.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. Therefore, while certain exemplary embodiments of the composition and methods of using and making the same disclosed herein have been discussed and illustrated, it is to be distinctly understood that the invention is not limited thereto but may be otherwise variously embodied and practiced within the scope of the following claims.

What is claimed is:
1. A piezoelectric composition, comprising:
0.24 Pb(In$_{1/2}$Nb$_{1/2}$)O$_3$-0.42Pb(Mg$_{1/3}$Nb$_{2/3}$)O$_3$-0.34Pb-TiO$_3$ (PIN-PMN-PT) doped with MnO$_2$ and CuO;
wherein 0.0 wt %<CuO <0.5 wt %; and
wherein MnO$_2$ is 2 mol %.

2. The piezoelectric composition of claim 1, wherein:

the PIN-PMN-PT includes 2 mol % $MnO_2$ and >0.0 wt % CuO, wherein $d_{33}$=370 pC/N, $Q_m$=1693, $E_c$=9.33 KV/cm, and a $Q_m \cdot d_{33} \cdot E_c$=0.584;

the PIN-PMN-PT includes 0.125 wt % CuO and 2 mol % $MnO_2$, wherein $d_{33}$=363 pC/N, $Q_m$=2800, $E_c$=10.1 KV/cm, and a $Q_m \cdot d_{33} \cdot E_c$=1.03;

the PIN-PMN-PT includes 0.25 wt % CuO and 2 mol % $MnO_2$, wherein $d_{33}$=374 pC/N, $Q_m$=2096, $E_c$=9.81 KV/cm, and a $Q_m \cdot d_{33} \cdot E_c$=0.769; or the PIN-PMN-PT includes 0.5 wt % CuO and 2 mol % $MnO_2$, wherein $d_{33}$=372 pC/N, $Q_m$=1921, $E_c$=10.1 KV/cm, and a $Q_m \cdot d_{33} \cdot E_c$=0.726.

3. A piezoelectric composition, comprising:

0.24 $Pb(In_{1/2}Nb_{1/2})O_3$-0.42$Pb(Mg_{1/3}Nb_{2/3})O_3$-0.34Pb-$TiO_3$ (PIN-PMN-PT) doped with $MnO_2$;

wherein $MnO_2$ is 2 mol %; and wherein the composition is textured via a templated grain growth (TGG) method using a $BaTiO_3$ template.

4. The piezoelectric composition of claim 3, wherein the $BaTiO_3$ content is 0.0 vol. %<$BaTiO_3$≤5 vol. %.

5. The piezoelectric composition of claim 3, wherein the PIN-PMN-PT is doped with CuO.

6. The piezoelectric composition of claim 5, wherein the composition has 0.0 wt %<CuO≤0.5 wt %.

7. The piezoelectric composition of claim 5, wherein the PIN-PMN-PT includes 0.25 wt % CuO and 2 mol % $MnO_2$, wherein $d_{33}$>710 pC/N, $k_{31}$=0.52, and $Q_m \approx 950$.

8. The piezoelectric composition of claim 3, wherein:

the PIN-PMN-PT includes 1 vol. % $BaTiO_3$, wherein $d_{33}$=457 pC/N, $Q_m$=1249, and $T_c$=207° C.;

the PIN-PMN-PT includes 2 vol. % $BaTiO_3$, wherein $d_{33}$=517 pC/N, $Q_m$=1148, and $T_c$=205° C.;

the PIN-PMN-PT includes 3 vol. % $BaTiO_3$, wherein $d_{33}$=529 pC/N, $Q_m$=1023, and $T_c$=205° C.; or the PIN-PMN-PT includes 5 vol. % $BaTiO_3$, wherein $d_{33}$=475 pC/N, $Q_m$=770, and $T_c$=199° C.

* * * * *